United States Patent
Larsson et al.

(10) Patent No.: US 9,570,971 B2
(45) Date of Patent: Feb. 14, 2017

(54) DETERMINATION OF PHASE OFFSETS IN A POWER SUPPLY SYSTEM HAVING MULTIPLE SWITCHING CONVERTERS

(71) Applicant: Telefonaktiebolaget L M Ericsson (publ), Stockholm (SE)

(72) Inventors: Andreas Larsson, Kalmar (SE); Torbjorn Holmberg, Kalmar (SE); Magnus Mellteg, Kalmar (SE)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 276 days.

(21) Appl. No.: 14/399,140

(22) PCT Filed: Nov. 27, 2013

(86) PCT No.: PCT/EP2013/074845
§ 371 (c)(1),
(2) Date: Nov. 5, 2014

(87) PCT Pub. No.: WO2015/078495
PCT Pub. Date: Jun. 4, 2015

(65) Prior Publication Data
US 2016/0322892 A1    Nov. 3, 2016

(51) Int. Cl.
*H02M 1/14*   (2006.01)
*H02M 3/156*  (2006.01)
(Continued)

(52) U.S. Cl.
CPC ............... *H02M 1/15* (2013.01); *G01R 29/18* (2013.01); *H02M 2001/008* (2013.01)

(58) Field of Classification Search
CPC ........ H02M 1/14; H02M 3/156; H02M 3/157; H02M 1/584; H02M 2001/007; H02M 1/15; H02M 2001/008; H02M 2003/1586; G01R 29/18
See application file for complete search history.

(56) References Cited

U.S. PATENT DOCUMENTS

2005/0052163 A1* 3/2005 Sutardja .............. H02M 3/1584
                                                        323/222
2008/0018313 A1  1/2008 Cagno et al.
(Continued)

FOREIGN PATENT DOCUMENTS

DE    10261739    7/2004
DE    10352508    6/2005

OTHER PUBLICATIONS

PCT Notification of Transmittal of the International Search Report and the Written Opinion of the International Searching Authority for Counterpart PCT Application No. PCT/EP2013/074845, (Sep. 4, 2014), 11 pages.
(Continued)

*Primary Examiner* — Rexford Barnie
*Assistant Examiner* — Terrence Willoughby
(74) *Attorney, Agent, or Firm* — Nicholson De Vos Webster & Elliott LLP

(57) ABSTRACT

A controller for determining switching phases among switching elements of a power supply system having voltage converters, each comprising a switching element. The controller receives signals indicative of a contribution from each converter to a ripple voltage component of an input current of the converters, and ranks the converters. The controller calculates a switching phase offset that is to be applied for the switching element by: (i) calculating phase offsets of two highest ranked converters that would minimize an input voltage ripple caused by said two highest ranked converters, (ii) calculating a phase offset of a next-highest ranked converter that would minimize an input voltage ripple caused by said next-highest ranked converter and converters
(Continued)

ranked higher than said next-highest converter; and (iii) repeating step (ii) for each converter in the ranking. The controller generates output signals defining the calculated switching phase offsets to be applied to the switching elements.

22 Claims, 15 Drawing Sheets

(51) Int. Cl.
*H02M 1/15* (2006.01)
*G01R 29/18* (2006.01)
*H02M 1/00* (2006.01)

(56) References Cited

U.S. PATENT DOCUMENTS

| | | |
|---|---|---|
| 2009/0189443 A1 | 7/2009 | Lin |
| 2010/0096923 A1 | 4/2010 | Marsili et al. |
| 2010/0321080 A1 | 12/2010 | Chen et al. |
| 2012/0230070 A1 | 9/2012 | Chen et al. |

OTHER PUBLICATIONS

Hegarty, T., "Reducing buck converter input capacitance through multi-phasing and clock synchronization", *EDN Network*. (Jan. 28, 2008), 17 pages.

\* cited by examiner

DETERMINATION OF PHASE OFFSETS IN A POWER SUPPLY SYSTEM HAVING MULTIPLE SWITCHING CONVERTERS

CROSS-REFERENCE TO RELATED APPLICATIONS

This application is a National stage of International Application No. PCT/EP2013/074845, filed Nov. 27, 2013, which is hereby incorporated by reference.

TECHNICAL FIELD

The disclosure herein generally relates to the field of power supply systems having a plurality of voltage converters, each configured to convert an input voltage to an output voltage by switching a switching element at a predetermined frequency, and more specifically to the determination of a distribution of switching phases among the voltage converters in such power supply systems.

BACKGROUND

In recent years, the development of power supply systems having multiple switching voltage converters has led to improvements in the performance and efficiency of many kinds of electronic equipment.

For example, the demand for ever faster and more complex signal and data processing in diverse fields of application has fuelled the need for new generations of signal processing systems having multiple high-performance integrated circuits (e.g. processors, ASICs and FPGAs), which are characterised by their need for multiple low supply voltages, high levels of current demand and tight supply voltage regulation requirements. These needs are met by multi-converter power supply systems such as the so-called Intermediate Bus Architecture (IBA) power supply, which provides a number of tightly-regulated voltages from an input power source via a two-stage voltage conversion arrangement.

FIG. 1 is a schematic showing an example of a conventional IBA power supply. In the example of FIG. 1, the IBA power system 10 is a two-stage power distribution network comprising a first stage DC/DC converter 20 connected to an input power bus 30, which is typically at a voltage $V_{DCH}$ between 36-75 V, 18-36 V or 18-60 V. The IBC 20 is typically implemented in the efficient form of a switched mode power supply (SMPS), which may be fully regulated or line regulated to convert the input power bus voltage $V_{DCH}$ to a lower intermediate bus voltage $V_{IB}$ on the Intermediate Voltage Bus (IVB) 40. The first stage DC/DC converter 20 is connected via the IVB 40 to the inputs of a number (N) of second stage DC/DC voltage converters 50-1 to 50-N.

In the example of FIG. 1, each of the plurality of second stage DC/DC voltage converters 50-1 to 50-N is a non-isolated buck regulator commonly referred to as a Point-of-Load (POL) regulator. In general, each of the POL regulators may be isolated or non-isolated. However, where isolation is provided by the IBC 20, the POL regulators are preferably all non-isolated. Each POL regulator (k) is an SMPS and delivers a regulated voltage $Vout_k$ to its load 60-$k$ by switching a switching element (such as a power MOSFET) in the POL with a switching duty cycle that determines the voltage conversion ratio. In the example of FIG. 1, POL regulators 50-1 and 50-2 deliver power to a common load 60-1 (although more than two POL regulators may deliver power to a common load).

Although the IBC 20 and the POL regulators 50-1 to 50-N are buck regulators in the example of FIG. 1, their topology is not limited to such and may alternatively be Boost, Buck-Boost etc.

In such a power supply system having a plurality of voltage converters 50-1 to 50-N, the switching phases of the converters 50-1 to 50-N may need to be offset relative to one another in order to reduce certain undesirable effects in the system. These undesirable effects include a large ripple voltage in the IVB 40 and high levels of radiated emissions due to synchronized edges of the switching pulses. It should be noted that these problems are not particular to IBA power supplies and arise in many other applications that make use of multiple switching voltage converters, such as current sharing rails and tracking/sequencing groups.

So-called "phase spreading" is one method of mitigating these effects. The simplest way of phase spreading is to allow the voltage converters (in the example of FIG. 1, the POL regulators 50-1 to 50-N) to operate individually, from their own internally generated clock. This randomizes the occurrence of switching pulse edges in time, thereby reducing the likelihood of switching pulses coinciding such that a high peak current is momentarily drawn from the input source that feeds the voltage converters (i.e. the IBC 20 in the example of FIG. 1).

A more controlled and effective way of phase spreading involves controlling the switching of the voltage converters on the basis of a common clock signal, and distributing respective switching pulse edges of the voltage converters through the switching period. In this case, a single clock source is used for all of the converters and each converter has its switching phase offset set to a different value within a period of the switching cycle, $T_s$. For example in a group of three voltage converters operating with a common duty cycle, phase offsets of $T_s/3$ may be introduced between the converters. This type of phase spreading effectively reduces the input ripple voltage and also reduces the magnitude and increases the frequency, of radiated emissions.

As the number of voltage converters in such power supply systems increases and the demand for higher currents becomes more common, there is an increasing need for an optimised controlled phase spreading that results in lowest possible input ripple voltage. This is not merely a task of distributing the phase offsets equally throughout a period of the switching cycle because, as will be explained in the following, the contribution from each converter to the input ripple voltage depends on the duty cycle with which the converter operates and the its load current.

Heretofore, it has been usual to manually select the phase offset for each voltage converter when configuring the power supply system prior to use. However, as the number of converters increases, the number of possible combinations of phase offset values increases dramatically. This makes it very difficult to manually find the phase offsets giving the lowest input voltage ripple. Furthermore, known approaches to setting the phase offsets have been much too slow to allow for phase offsets to be optimised "on the fly", in response to changes in the voltage converters' loads during operation of the power supply system, and thereby maintain a low input voltage ripple.

SUMMARY

In view of the problems with conventional approaches to distributing the switching phases among the voltage converters in power supply systems as described above, the present inventors have devised a computationally efficient scheme for determining a near-optimal distribution of switching phase offsets among the switching elements in the system, which allows the input voltage ripple, and any input capacitance that may be provided in the power supply system, to be effectively reduced.

More specifically, one embodiment described herein provides a controller for determining a distribution of switching phases among switching elements of a power supply system, the power supply system comprising a plurality of voltage converters, wherein each voltage converter comprises a switching element and is arranged to convert an input voltage supplied to the voltage converters to a respective output voltage by switching the switching element at a predetermined switching frequency. The controller comprises a receiver for receiving one or more signals indicative of a respective contribution from each of the voltage converters to a ripple voltage component of the input voltage supplied to the voltage converters, and a rank determining module that is configured to rank the voltage converters in order of decreasing contribution to the ripple voltage. The controller further comprises a switching phase offset calculator configured to calculate a respective switching phase offset that is to be applied for the switching element in each of the voltage converters by: (i) calculating respective phase offsets of the two highest ranked voltage converters that would minimise an input voltage ripple caused only by said two highest ranked voltage converters; (ii) calculating a phase offset of the next-highest ranked voltage converter that would minimise an input voltage ripple caused only by said next-highest ranked voltage converter and the voltage converters ranked higher than said next-highest voltage converter; and (iii) repeating step (ii) for each subsequent voltage converter in the ranking. The controller also includes an output signal generator configured to generate one or more output signals defining the calculated switching phase offsets to be applied to the switching of the respective switching elements.

By ranking the voltage converters in order of decreasing contribution to the ripple voltage, the rank determining module is able to generate a list of the voltage converters, wherein the voltage converters are listed in order of decreasing contribution to the ripple voltage component of the input voltage supplied to the voltage converters. In this embodiment, the switching phase offset calculator is configured to determine the switching phase offsets of the voltage converters by firstly determining respective phase offsets of the two highest ranked voltage converters that would minimise an input voltage ripple caused only by said two highest ranked voltage converters, and by then calculating, for the third and each subsequent voltage converter in the list, in turn, the phase offset that substantially minimises the input voltage ripple which would be caused only by operation of that voltage converter and those voltage converters higher up in the list. In this way, it possible to calculate a near-optimal distribution of the switching phase offsets among the voltage converters in the system in a highly efficient way.

According to another embodiment, which takes advantage of the highly efficient phase offset determination scheme described herein to control the distribution of the switching phase offsets "on the fly", so that a low input voltage ripple can be maintained during operation of the power supply system, there is provided a controller for controlling a distribution of switching phases among switching elements of a power supply system, the power supply system comprising a plurality of voltage converters, wherein each voltage converter comprises a switching element and is arranged to convert an input voltage supplied to the voltage converters to a respective output voltage by switching the switching element at a predetermined switching frequency. The controller comprises a receiver for receiving one or more signals indicative of a respective contribution from each of the voltage converters to a ripple voltage component of the input voltage supplied to the voltage converters, and a switching phase offset regulator for regulating switching phase offsets of the switching elements during operation of the power supply system. The switching phase offset regulator comprises a switching phase offset calculator configured to calculate, based on the received signal(s), a respective switching phase offset that is to be applied for the switching element in each of the voltage converters, the calculated switching phase offsets being such as to substantially minimise the input voltage ripple. The switching phase offset regulator further comprises a control signal generator configured to generate one or more control signals defining the calculated switching phase offsets to be applied to the switching of the respective switching elements. The switching phase offset regulator of this embodiment is responsive to changes in the received one or more signals to recalculate the switching phase offsets and generate control signals corresponding to the recalculated switching phase offsets during operation of the power supply system.

Another embodiment provides a power supply system, comprising a plurality of voltage converters, wherein each voltage converter comprises a switching element and is arranged to convert an input voltage supplied to the voltage converters to a respective output voltage by switching the switching element at a predetermined switching frequency. The power supply system further comprises a controller according to any of the embodiments set out above, for controlling a distribution of switching phases among the switching elements.

A further embodiment provides, in a power supply system comprising a plurality of voltage converters, wherein each voltage converter comprises a switching element and is arranged to convert an input voltage supplied to the voltage converters to a respective output voltage by switching the switching element at a predetermined switching frequency, a method of determining a distribution of switching phases among the switching elements. The method comprises receiving one or more signals indicative of a respective contribution from each of the voltage converters to a ripple voltage component of the input voltage supplied to the voltage converters, and ranking the voltage converters in order of decreasing contribution to the ripple voltage. The method further comprises calculating a switching phase offset that is to be applied for the switching element in each of the voltage converters by: (i) calculating respective phase offsets of the two highest ranked voltage converters that would minimise an input voltage ripple caused only by said two highest ranked voltage converters; (ii) calculating a phase offset of the next-highest ranked voltage converter that would minimise an input voltage ripple caused only by said next-highest ranked voltage converter and the voltage converters ranked higher than said next-highest voltage converter; and (iii) repeating step (ii) for each subsequent voltage converter in the ranking. One or more signals defining the calculated switching phase offsets that are to be applied to the switching of the respective switching elements are generated.

Another embodiment provides, in a power supply system comprising a plurality of voltage converters, wherein each voltage converter comprises a switching element and is arranged to convert an input voltage supplied to the voltage converters to a respective output voltage by switching the switching element at a predetermined switching frequency, a method of controlling a distribution of switching phases among the switching elements. The method comprises receiving one or more signals indicative of a respective contribution from each of the voltage converters to a ripple voltage component of the input voltage supplied to the voltage converters, and regulating the switching phase offsets of the switching elements during operation of the power supply system by: calculating, based on the received signal(s), a respective switching phase offset that is to be applied for the switching element in each of the voltage converters, the switching phase offsets being calculated so as to substantially minimise the ripple voltage component; and generating one or more control signals defining the calculated switching phase offsets to cause the calculated switching phase offsets to be applied to the switching of the respective switching elements. According to this method, the switching phase offsets are recalculated in response to changes in the received signal(s), and one or more control signals corresponding to the recalculated switching phase offsets are generated during operation of the power supply system.

Further embodiments described herein provide a computer program product, comprising a computer-readable storage medium or a signal, carrying computer program instructions which, when executed by a processor, cause the processor to perform a method as set out in one or more of the embodiments above.

BRIEF DESCRIPTION OF THE DRAWINGS

Embodiments of the invention will now be described, by way of example only, with reference to the accompanying drawings in which.

DETAILED DESCRIPTION OF EMBODIMENTS

First Embodiment

Figure 2:
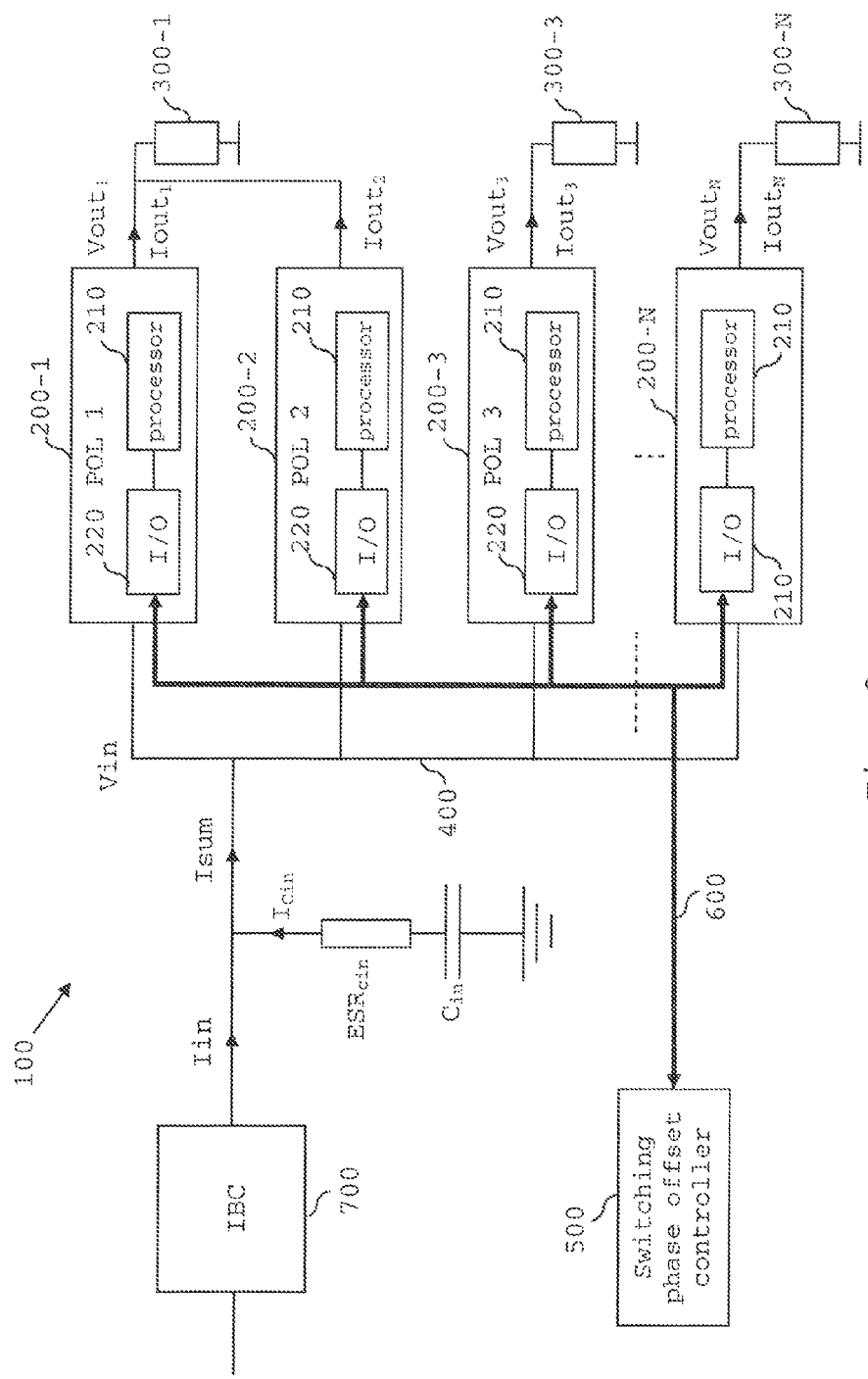
FIG. 2 illustrates a power supply system according to a first embodiment of the present invention.

FIG. 2 is a schematic of a power supply system having a plurality of voltage converters in accordance with a first embodiment of the present invention, which takes the form of an IBA power system.

Figure 1:
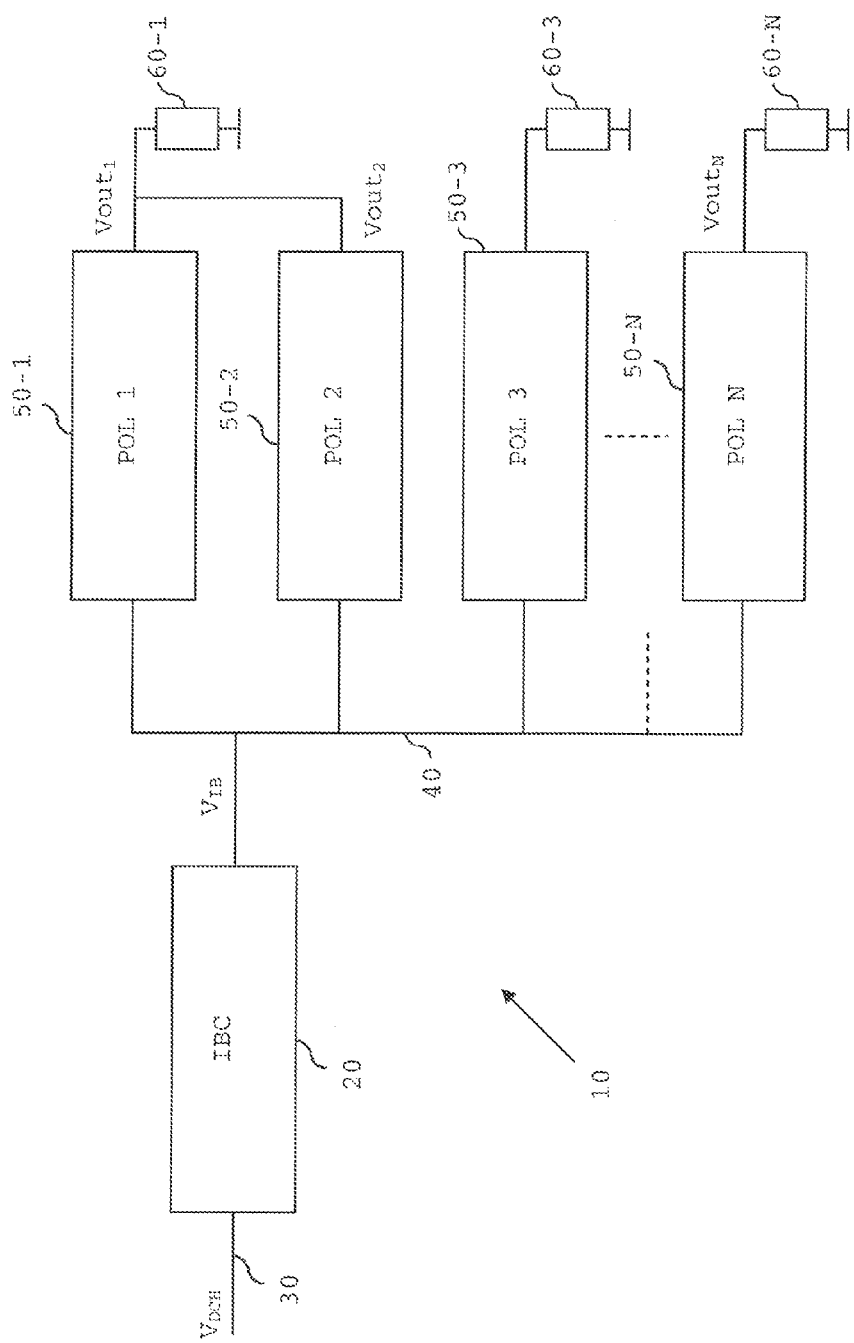
FIG. 1 illustrates an IBA power system as an example of a conventional power supply system having multiple switching voltage converters.

The IBA power system 100 shown in FIG. 2 comprises a plurality of voltage converters 200-1 to 200-N, each of which is a buck-topology regulator in the form of an SMPS, as in the example of FIG. 1. Thus, each of the voltage converters 200-1 to 200-N delivers a regulated output voltage $Vout_k$ to its load 300-$k$ by switching a switching element (such as a power transistor, e.g. a power MOSFET) in the voltage converter. However, it should be noted that output voltage regulation is not an essential feature of the voltage converters 200-1 to 200-N so that, in general, only some of voltage converters 200-1 to 200-N, or none of voltage converters 200-1 to 200-N, may provide a regulated output voltage.

The switching of the switching element in a voltage converter 200-$k$ occurs in accordance with a drive signal comprising a series of pulses. These pulses are characterised by a duty cycle $D_k$ that determines the voltage conversion ratio according to which the voltage converter 200-$k$ converts the input voltage Vin supplied thereto via the intermediate voltage bus (IVB) 400 into the respective output voltage $Vout_k$. In the present embodiment, voltage converters 200-1 and 200-2 deliver power to a common load 300-1 (although, more generally, one, two or more than two voltage converters may deliver power to a load).

Although the value of the switching duty cycle may vary from converter to converter, the switching elements in the converters 200-1 to 200-N all switch at a common switching frequency $1/T_s$, which is defined by a switch timing signal generated by a clock that may, in general, be located within one of the voltage converters 200-1 to 200-N, within another component of the power supply system 100 (e.g. the controller 500 or IBC 700 described herein below), or externally of the power supply system 100.

Each of the voltage converters 200-1 to 200-N is provided with a signal processor 210, and an input/output (I/O) interface 220 by which it can be digitally controlled and managed by a switching phase offset controller 500 via a control signal bus 600. In the present embodiment, control signals including the aforementioned switch timing signal are communicated from the switching phase offset controller 500 to the voltage converters 200-1 to 200-N using the PMBus protocol.

The switching phase offset controller 500 may be provided as a stand-alone hardware component, as illustrated in FIG. 2, or may be integrated as part of an on-board controller (not shown), the IBC 700 or one of the voltage converters 200-1 to 200-N, or as part of an off-board controller. The switching phase offset controller 500 regulates the switching phase offsets of the converters 200-1 to 200-N so as to maintain a near-optimal distribution of the phase offsets that substantially minimises the voltage ripple in the IVB 400 and radiated emissions from the voltage converters 200-1 to 200-N. The operation of the switching phase offset controller 500 will be described in detail below.

Power may be supplied to the voltage converters 200-1 to 200-N from any suitable source. In the present embodiment, power is fed to the voltage converters 200-1 to 200-N via a first stage DC/DC converter 700 and the IVB 400. The first stage DC/DC converter 700 may be an isolated DC/DC converter. An IBA power supply having such a first stage DC/DC converter or IBC has the advantage of being more efficient and more cost-effective to manufacture because isolation from a power source upstream of the IBC, which generally requires the use of relatively costly components including a transformer, is provided at a single converter. Alternatively, the IBC 700 may not provide electrical isolation. The IBC 700 is preferably implemented in the efficient form of an SMPS, which can be fully regulated or line regulated to convert a source voltage input thereto to a lower voltage Vin, as shown in FIG. 2.

As also shown in FIG. 2, a low-pass filter is connected at the common input of the bank of voltage converters 200-1 to 200-N, which includes a capacitor having a capacitance $C_{in}$ and an equivalent series resistance (ESR) of $ESR_{Cin}$.

Figure 3:
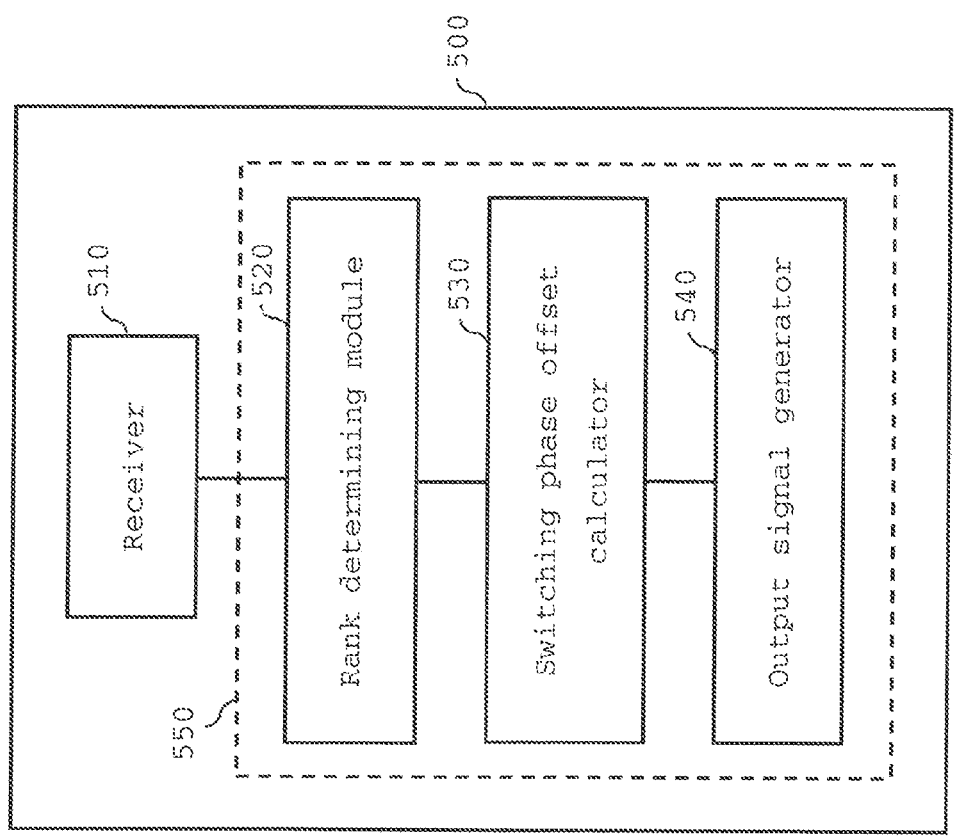
FIG. 3 illustrates functional components of the switching phase offset controller shown in FIG. 2.

FIG. 3 shows key function components of the switching phase offset controller 500. The controller 500 comprises a receiver 510, a rank determining module 520, a switching phase offset calculator 530, and an output signal generator 540, which are functionally inter-connected as shown. In the present embodiment, the rank determining module 520, switching phase offset calculator 530, and output signal generator 540 together function as a switching phase regulator 550. The functionality of these components of the switching phase offset controller 500 will be described in detail below.

Figure 4:
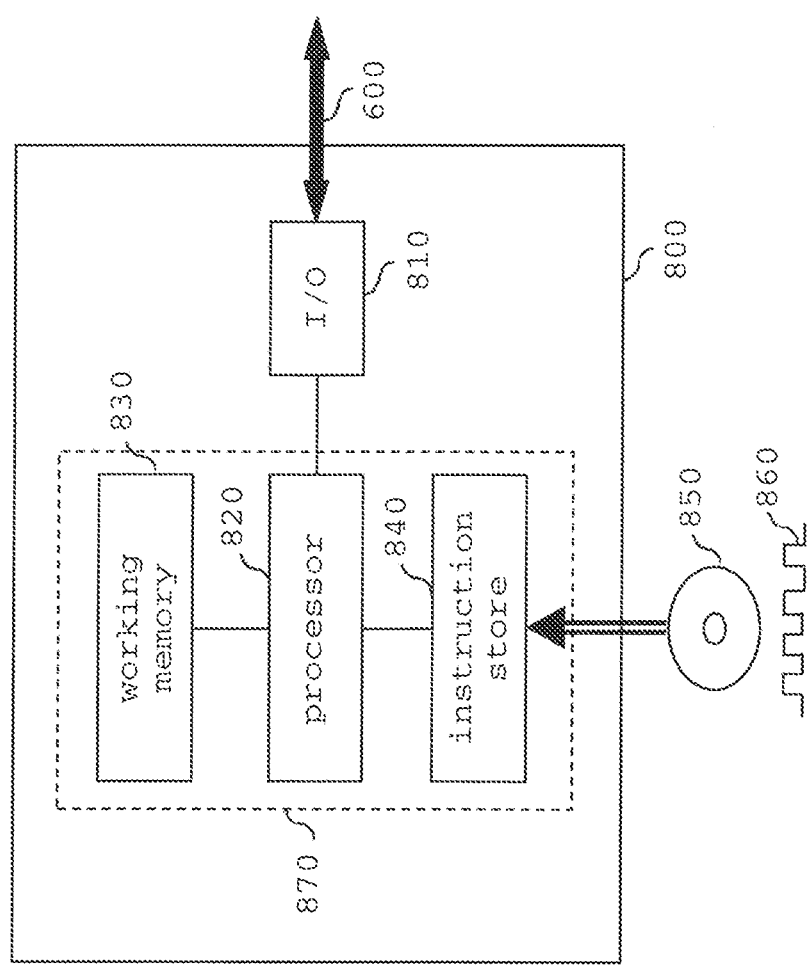
FIG. 4 shows an exemplary hardware implementation of the switching phase offset controller shown in FIG. 2.

FIG. 4 shows an exemplary implementation of the switching phase offset controller 500, in programmable signal processing hardware. The signal processing apparatus 800 shown in FIG. 4 comprises an input/output (I/O) or receiving section 810 for receiving signals hereinafter described from the voltage converters 200-1 to 200-N. The receiver 810 is connected to the I/O interfaces 220 of the voltage converters 200-1 to 200-N via the control signal bus 600, which enables an exchange of information and control signals therebetween. In particular, the receiver 810 is configured to receive information concerning the voltage converters' operating conditions, including their respective output currents $Iout_k$, and either their respective measured output voltages $Vout_k$ or duty cycles $D_k$.

As shown in FIG. 4, the signal processing apparatus 800 further comprises a processor 820, a working memory 830 and an instruction store 840 storing computer-readable instructions which, when executed by the processor 820 cause the processor 820 to perform the processing operations hereinafter described to calculate a respective switching phase offset that is to be applied for the switching element in each of the voltage converters 200-1 to 200-N, and generate output signal(s) defining the calculated switching phase offsets to be applied to the switching of the respective switching elements. The instruction store 840 may comprise a ROM which is pre-loaded with the computer-readable instructions. Alternatively, the instruction store 840 may comprise a RAM or similar type of memory, and the computer readable instructions can be input thereto from a computer program product, such as a computer-readable storage medium 850 such as a CD-ROM, etc. or a computer-readable signal 860 carrying the computer-readable instructions.

In the present embodiment, the combination 870 of the hardware components shown in FIG. 4, comprising the processor 820, the working memory 830 and the instruction store 840, is configured to implement the functionality of the aforementioned rank determining module 520, switching phase offset calculator 530 and output signal generator 540, which will now be described in detail with reference to FIG. 5.

Figure 5:
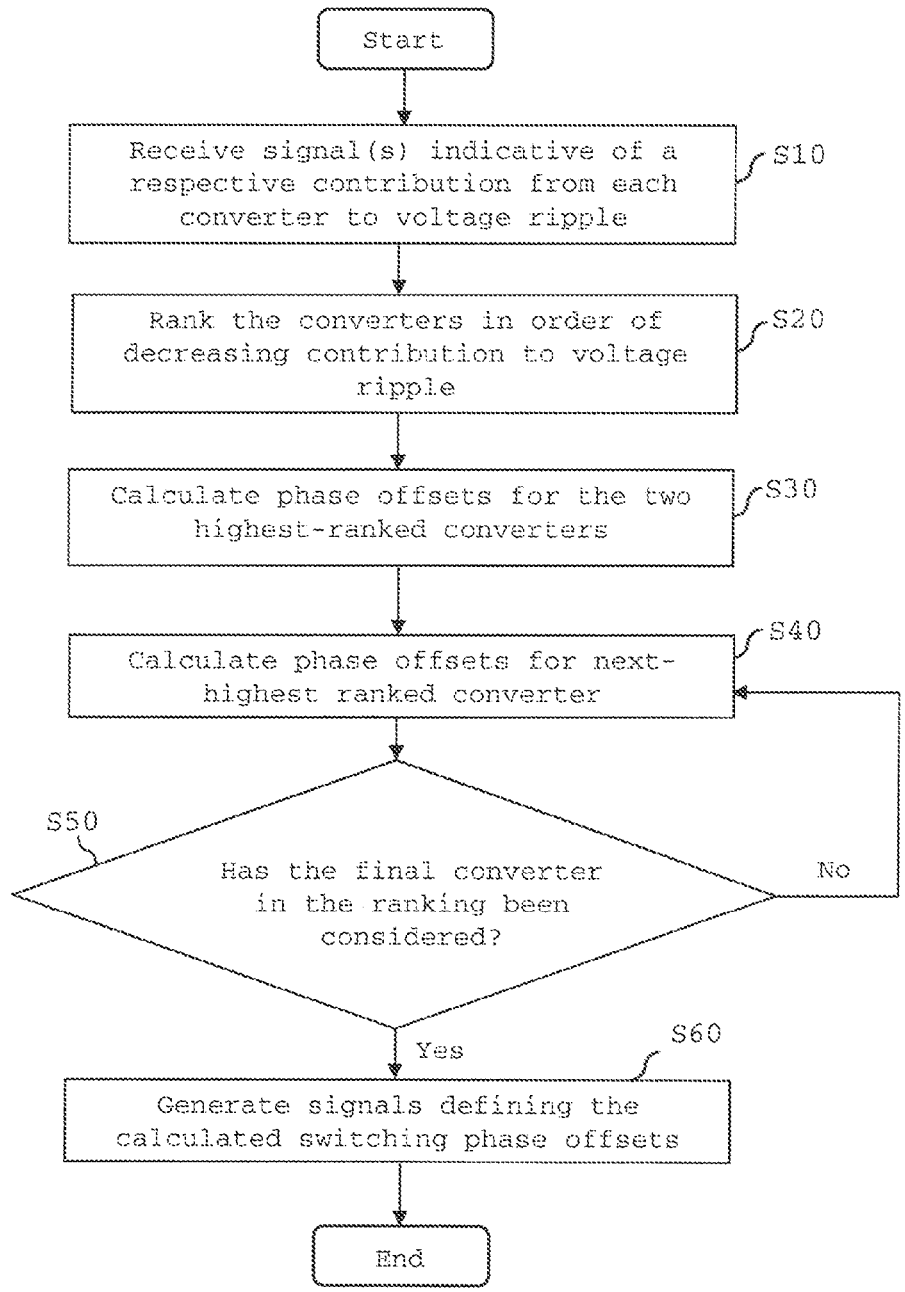
FIG. 5 is a flow diagram illustrating a method of controlling the distribution of switching phase offsets in the power supply system of FIG. 2.

FIG. 5 is a flow chart illustrating a process by which the controller 500 controls the distribution of switching phase offsets in the power supply system 100.

In step S10, the receiver 510 receives one or more signals indicative of a respective contribution from each of the voltage converters 200-1 to 200-N to a ripple voltage Vripple that forms part of the overall input voltage on the IVB 400. In the present embodiment, the receiver 510 receives signals that are indicative of a respective output current $Iout_k$ and output voltage $Vout_k$ of each voltage converter 200-k. More specifically, the received signals convey measured values of the output current $Iout_k$ and output voltage $Vout_k$ of each voltage converter 200-k, which are measured during operation of the power supply system 100, when each voltage converter supplies power to a load 300-k. During such operation, the measured values of the output voltage are indicative of the contributions made by the respective voltage converters to the input voltage ripple. It should be noted, however, that the received signals may indicate, instead of the converter's measured output voltage $Vout_k$, the respective switching duty cycle $D_k$ used by each voltage converter 200-k when it operates to supply power to its load 300-k. The switching duty cycle $D_k$ of the switching element in voltage converter 200-k is related to its output voltage, $Vout_k$, by a well-defined relation. For example, the output voltage $Vout_k$ may be related to $D_k$ by the expression $Vout_k = \eta_k D_k Vin$, where $\eta_k$ is the efficiency of voltage converter 200-k.

Furthermore, as will be explained in the following, the received signals may alternatively convey estimated (rather than measured) values of the respective output current $Iout_k$ and output voltage $Vout_k$ (or duty cycle $D_k$) of each voltage converter 200-k, which are predicted to occur during operation of the power supply system 100. In such an alternative embodiment, the expected values of these parameters may be transmitted to the controller 500 by a user via a user interface (e.g. a guided user interface (GUI) on a display such as an LCD monitor) during configuration of the power supply system.

In step S20 of FIG. 5, the rank determining module 520 ranks the voltage converters 200-1 to 200-N in order of decreasing contribution to the ripple voltage Vripple, on the basis of the signals received at step S10. Thus, in step S20, the rank determining module 520 can be considered to order the voltage converters 200-1 to 200-N in a list, in accordance with the size of their respective contributions to the ripple voltage Vripple, so that the voltage converter providing (or expected to provide) the greatest contribution to the ripple voltage Vripple is placed at the top of the list and the voltage converter providing (or expected to provide) the smallest contribution appears at the bottom of the list.

The contribution that each of the voltage converters 200-1 to 200-N makes to the ripple voltage Vripple during operation of the power supply system 100 may be estimated in one of a number of ways. In the present embodiment, the received value of the measured output current $Iout_k$ of voltage converter 200-$k$ is taken to provide an indication of the contribution made by voltage converter 200-$k$ to the ripple voltage Vripple; the greater the value of $Iout_k$, the greater this contribution is assumed to be. The rank determining module 520 therefore ranks the voltage converters 200-1 to 200-N in order of decreasing values of the output current.

In step S20, the situation may arise where two or more of the voltage converters 200-1 to 200-N have (or, in the above-mentioned alternative embodiment, are predicted to provide) the same output current (i.e. within the accuracy with which the output current can be measured or predicted). In this case, to enable the ranking of these voltage converters (i.e. to decide the order in which these converters should appear in the list), the rank determining module 520 further ranks these two or more voltage converters in order of decreasing values of the output voltage $Vout_k$ (or $D_k$, as the case may be).

It should be noted that the rank determining module 520 may alternatively rank the voltage converters 200-1 to 200-N in order of decreasing values of the output voltage $Vout_k$ when the voltage converters are arranged to supply power to a respective load (or, as the case may be, the respective duty cycle, $D_k$, of the switching element in each voltage converter when each voltage converter is arranged to supply power to a respective load) and, where two or more of the voltage converters 200-1 to 200-N have (or, in the above-mentioned alternative embodiment, are predicted to provide) the same value of the output voltage $Vout_k$ (or $D_k$, as the case may be), then the rank determining module 520 further ranks these two or more voltage converters in order of decreasing values of the output current.

Then, once the voltage converters 200-1 to 200-N have been ranked, the switching phase calculator 530 calculates a respective switching phase offset that is to be applied for the switching element in each of the voltage converters 200-1 to 200-N. The overall process of calculating these phase offset values is described below, and is based on values of the input voltage Vin, output voltage $Vout_k$, estimated nominal output current, and the efficiency $\eta_k$, of each converter 200-$k$ (for k=1 to N). The calculation method described below is not, however, limited to using nominal output current values of the converters, and may instead be based on maximum or minimum values of the respective output currents. In addition to the respective phase offset values for the converters 200-1 to 200-N, estimates of the resulting total input ripple current and voltage achieved are also calculated.

The calculations begin in step S30, wherein the switching phase calculator 530 calculates respective phase offsets (with respect to the common synchronisation clock) of the two highest ranked voltage converters, which would minimise an input voltage ripple caused only by said two highest ranked voltage converters. In other words, the switching phase calculator 530 calculates respective phase offset values for the two highest ranked voltage converters, which values would minimise the input voltage ripple if only those two highest-ranked voltage converters were present in the power supply system 100.

The switching phase calculator 530 may alternatively determine the phase offset values in step S30 by setting the phase of the highest-ranked converter to an arbitrary value (e.g. zero) and then calculate the phase offset value of the second-highest ranked converter that would minimise the input voltage ripple due only to those two highest-ranked voltage converters.

Then, in step S40, the switching phase calculator 530 calculates a phase offset of the next-highest ranked voltage converter (i.e. the third converter in the list) that would minimise an input voltage ripple caused only by said next-highest ranked voltage converter and the voltage converters ranked higher than said next-highest voltage converter (the two highest-ranked converters).

In step S50, the switching phase calculator 530 determines whether the phase offset for the final voltage converter in the ranking/list has been calculated and, if not, repeats the calculation in step S40 for the next voltage converter in the ranking generated at step 20. Thus, in the next performance of step S40, the switching phase offset calculator 530 calculates a phase offset of the next-highest ranked voltage converter (i.e. the fourth converter identified in the list) that would minimise an input voltage ripple caused only by said next-highest ranked voltage converter and the voltage converters ranked higher than said next-highest voltage converter; namely, the converters which were considered in step S30 and the first performance of step S40, i.e. the three highest-ranked converters.

Through this process of repeating step S40, with each repetition calculating a near-optimal phase offset for the next voltage converter in the ranking, the switching phase calculator 530 determines a respective switching phase offset that is to be applied for the switching element in each of the voltage converters 200-1 to 200-N in the power supply system.

To facilitate understanding of how the phase offsets are calculated in steps S30 and S40 of FIG. 5, a review of the relevant background theory will now be provided, followed by a detailed description of the calculation process employed in the present embodiment.

Since all of the voltage converters 200-1 to 200-N are of the buck type in the present embodiment, the total average input current from the IVB 400 at Vin can be estimated as:

$$Iin = \sum_{k=1}^{N} \left( \frac{Iout_k \cdot Vout_k}{Vin \cdot \eta_k} \right) \qquad \text{Eqn. 1}$$

The duty cycle, $D_k$, of each converter gives the fractional time, $dt_k$, of the clock period $T_s$ during which each voltage converter draws current from the input supply, can be described as:

$$dt_k = T_s \cdot D_k = \frac{T_s \cdot Vout_k}{Vin \cdot \eta_k} \qquad \text{Eqn. 2}$$

The total current drawn from Vin and $C_{in}$ at a specific moment, Isum(t), can be estimated as the sum of Iout of the voltage converters switching at that moment:

$$Isum(t) = \sum_{n\_switching} Iout_n(t) \qquad \text{Eqn. 3}$$

This means that, at a specific moment of the clock period, the current drawn from the input capacitor, $I_{Cin}(t)$, can be estimated as the difference between Equations 3 and 1:

$$I_{Cin}(t) = I\text{sum}(t) - I\text{in} \qquad \text{Eqn. 4}$$

The input capacitor RMS current value, $I_{Cin,rms}$, (i.e. the input current ripple Iripple) is, by definition, given by:

$$I_{Cin,rms} = \sqrt{\frac{1}{T_s} \int_0^{T_s} I_{Cin}(t)^2 dt} \qquad \text{Eqn. 5}$$

the input voltage deviation dV during a time dt due to the current ripple can be estimated as:

$$dV = \frac{dt}{C_{in}} I_{Cin}(t) + ESR_{Cin} \cdot I_{Cin}(t) \qquad \text{Eqn. 6}$$

In order to find a suitable implementation in the real world, where there is a limited number of phase shifts achievable in the buck converters 200-1 to 200-N, it is necessary to consider a discrete solution. If the time resolution to be used for the calculations is taken to be dt, then the number of time slots P during the clock period is:

$$P = \frac{T_s}{dt} \qquad \text{Eqn. 7}$$

The number of time slots $dp_k$ that the duty cycle of each voltage converter 200-$k$ corresponds to then can be estimated, using Eqns. 2 and 7, as follows:

$$dp_k = \text{round}\left(\frac{T_s \cdot Vout_k}{Vin \cdot \eta_k \cdot dt}\right) \qquad \text{Eqn. 8}$$

Figure 6:
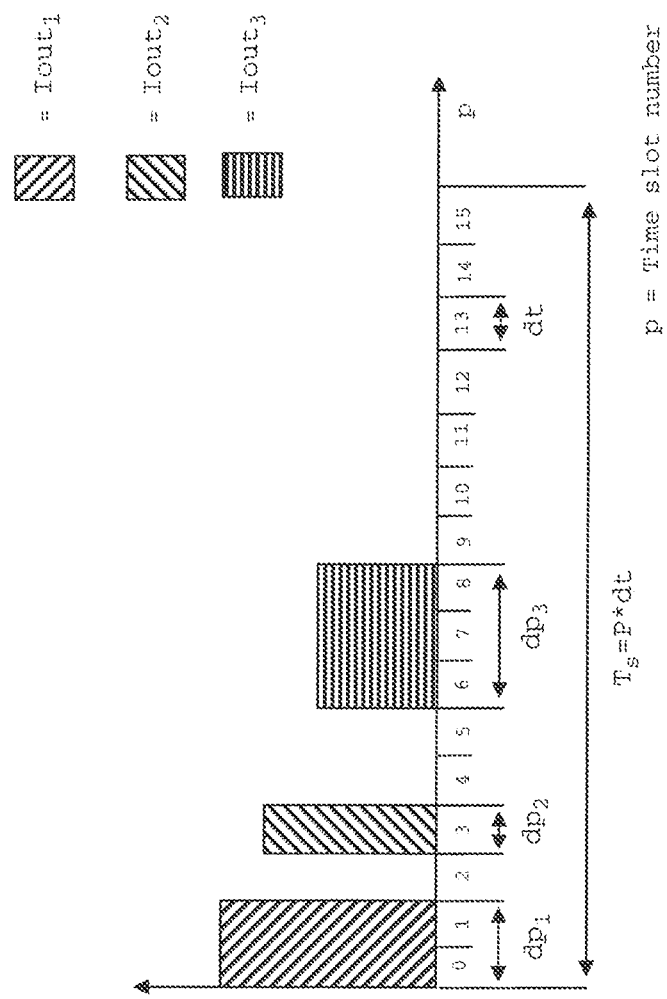
FIG. 6 illustrates the division, among time slots used in the phase offset calculations described herein, of portions of the switching cycles of three converters.

FIG. 6 shows the "high" portion of the switching cycle in each of three of the voltage converters. For clarity, the portions of the respective switching cycles, during which the switches in the converters are switched ON, are drawn to not overlap each other.

Figure 7:
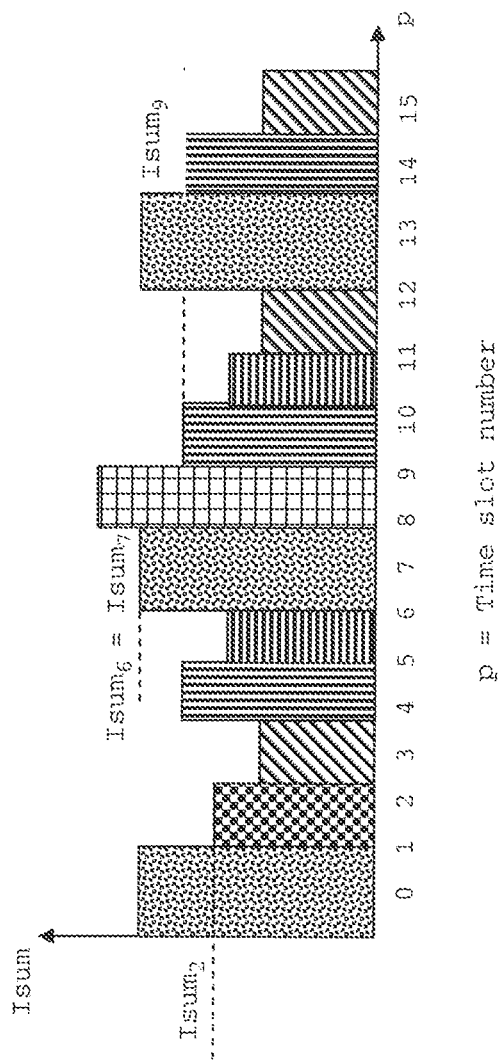
FIG. 7 illustrates the division, among time slots used in the phase offset calculations described herein, of portions of the switching cycles of multiple converters, where at least two of the converters are switched ON in some of the time slots.

FIG. 7 shows a more complex example, with the "high" portions of the switching cycle from a number of converters being offset with respect to one another. As shown in FIG. 7, in some of the time slots, there is more than one converter whose switch is in the conductive ("high") state. $Isum_p$ is defined as the sum of the currents from all of the converters whose switch is conducting in time slot p (see Eqn. 3 above).

$$Isum_p = \sum_{m_{switching\_in\_slot\_p}} Iout_m \qquad \text{Eqn. 9}$$

Each time slot will contribute to an input voltage deviation dV in accordance with Eqn. 6. For each time slot, this input voltage deviation dV can be positive or negative (with current flowing into or out from the capacitor $C_{in}$), depending on how the converters' switching phases are distributed during the clock period. Finding the time slots $j_1$ and $j_2$, where the total accumulated dV reaches its maximum and minimum, will give the peak-to-peak voltage deviation $V_{pp}$. Equations 3 and 4 in Eqn. 6 give:

$$V_{pp} = \qquad \text{Eqn. 10}$$
$$\max_{j_1 \in [0 \ldots P]} \left[ \sum_{p=0}^{j_1} \left( \frac{T_s}{P \cdot C_{in}} (Isum_p - Iin) + ESR_{Cin}(Isum_{j_1} - Iin) \right) \right] -$$
$$\min_{j_2 \in [0 \ldots P]} \left[ \sum_{p=0}^{j_2} \left( \frac{T_s}{P \cdot C_{in}} (Isum_p - Iin) + ESR_{Cin}(Isum_{j_2} - Iin) \right) \right]$$

In order to calculate phase offset values that would minimise the input voltage ripple, the expression for $V_{pp}$ in Eqn. 10 may be simplified by setting $ESR_{Cin}=0$ and $T_s=P=C_{in}=1$, and using the resulting indicator of the input voltage ripple in the calculations, as shown in the pseudo code representation of the algorithm that is provided below.

Figure 8:
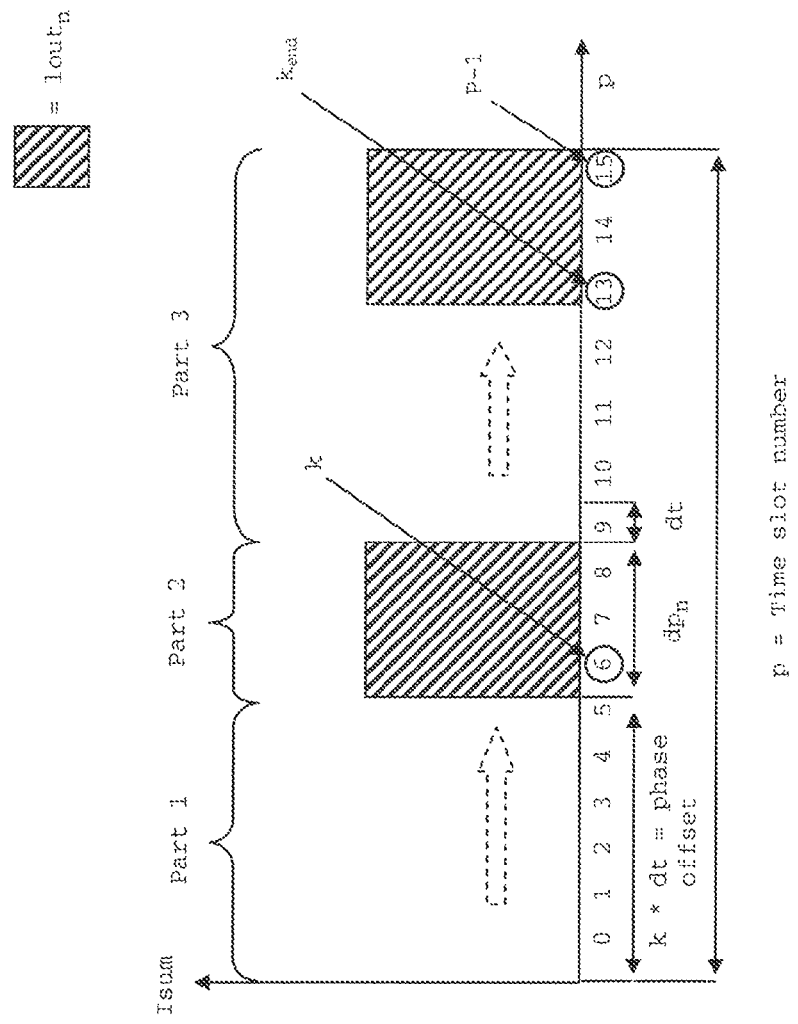
FIG. 8 illustrates the process of shifting the switching phase of converter n during calculation of the converter's optimum phase offset.

The algorithm used to calculate the phase offsets for the converters 200-1 to 200-N will evaluate this simplified form of Eqn. 10 for different phase offsets in order to find the offset giving the lowest input capacitor RMS voltage. FIG. 8 illustrates converter n placed at phase offset position k. Offset positions from k=0 to $k_{end}$, where $k_{end}=P-dp_n$, will be evaluated.

Above, it has been assumed that the resolution of the offsets k is the same as for p, namely dt. However, it may be preferable to perform the calculations using a small dt for the duty cycle, in order to achieve good accuracy, and a larger dt for k, which is typically limited by the physical devices used.

In the present embodiment, the resulting total input ripple current Iripple and the total input ripple voltage are also be estimated according to Eqns. 5 and 10.

In power supply systems having a large number of converters (e.g. five or more converters), evaluating all the possible combinations of phase offsets of the converters would be a very time-consuming process. To avoid this problem and greatly speed up the phase offset calculations in such power supply systems, the algorithm of the present embodiment starts by sorting the converters using one of the ranking processes described herein.

Figure 9:
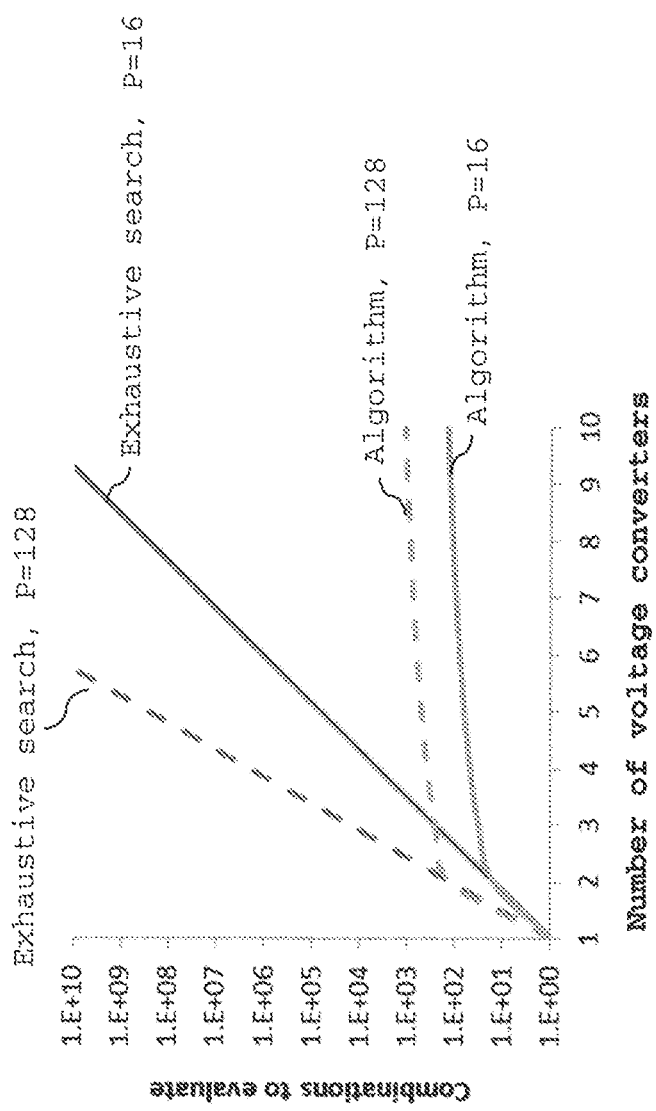
FIG. 9 illustrates the number of phase offset combinations to evaluate as a function of the number of voltage converters in the system when the configurable number of time slots P=16 and 128, in the case where an exhaustive search is carried out and, for comparison, when an algorithm according to an embodiment is used.

As will be appreciated from the foregoing description and the pseudo code provided below, the algorithm first determines the offset for the first converter in the ranking. Then, the next converter in the ranking is considered and the phase offset for that converter is calculated, and the process continues down to the last converter in the ranking. This significantly reduces the number of combinations of phase offsets that need to be evaluated. More specifically, the algorithm of the present embodiment requires P*(N−1) combinations of phase offsets to be considered in the calculation. In contrast, if an exhaustive search were to be made (i.e. evaluating all of the possible combinations), the number of evaluations would become $P^{N-1}$. The number of combinations to be evaluated as a function of the number of voltage converters N in the system is plotted in FIG. 9 for two different numbers of time slots, P, during the clock period, namely for P=16 and P=128.

The algorithm is further described by the pseudo code below.

```
//Rank the N number of converters in descending order according
//to the chosen sorting method, as described above.
//Define average input voltage, output voltage, output current
//and efficiency of converter n
```

-continued

```
Vin = ...
Vout_n = ...
Ioutn = ...
η_n = ...
//Define clock period (user input)
T_s = ...
//Define the time resolution to be used (slot width) (user
//input)
dt = ...
//Calculate the number of time slots
P = T_s / dt
//Calculate the number slots dp_n that the duty cycle of each
//converter n corresponds to, using the "ceiling" function,
//which rounds upwards to the closest integer
dp_n = ceiling(T_s * Vout_n / (Vin * dt * η_n))
//Initialize total current drawn by converters switching in
//each slot p of clock period
Isum_p = 0 for p = 0 to P-1
//For each converter (starting with the converter with highest
//output current)
For n = 1 to N (
    //For each converter (starting with the converter with
    //the highest output current)
    Iin = 0
    For m = 1 to n (
        Iin = Iin + Vout_m * Iout_m / (η_m * Vin)
    )
    //For each possible phase offset of k slots through the
    //clock period, determine last slot depending on duty
    //cycle of converter n
    k_end = P - dp_n
    For k = 0 to k_end (
        //For this specific offset, search for V_Cin,min and V_Cin,max,
        //in order to calculate V_Cin,pp
        V_Cin = 0
        V_Cin,min = [max value of type used]
        V_Cin,max = 0
        // Part 1: Converter n not switching
        If k ≠ 0 (
            For p = 0 to (k-1) (
                V_Cin = V_Cin + Isum_p - Iin
                If (V_Cin > V_Cin,max) (V_Cin,max = V_Cin)
                If (V_Cin < V_Cin,min) (V_Cin,min = V_Cin)
            )
        )
        // Part 2: Converter n switching
        For p = k to (k + dp_n - 1) (
            V_Cin = V_Cin + Isum_p + Iout_n - Iin
            If (V_Cin > V_Cin,max) (V_Cin,max = V_Cin)
            If (V_Cin < V_Cin,min) (V_Cin,min = V_Cin)
        )
        // Part 3: Converter n not switching
        If k < k_end (
            For p = (k + dp_n) to (P - 1) (
                V_Cin = V_Cin + Isum_p - Iin
                If (V_Cin > V_Cin,max) (V_Cin,max = V_Cin)
                If (V_Cin < V_Cin,min) (V_Cin,min = V_Cin)
            )
        )
        // Calculate peak-peak voltage ripple
        V_Cin,pp = V_Cin,max - V_Cin,min
        // Evaluate offset and update if minimum
        If (k = 0) or (V_Cin,pp < V_Cin,pp,min) (
            // Update minimum voltage ripple
            V_Cin,pp,min = V_Cin,pp
            // Save offset
            Offset_n = k
        )
    )
    //Update current sum for the slots where converter n is
    //finally placed
    For p = Offset_n to (Offset_n + dp_n - 1) (
        Isum_p = Isum_p + Iout_n
    )
    //Resulting offset for converter n
    TOffset_n = Offset_n * dt
)
//Find peak-to-peak input capacitor current (the slot with
//highest sum)
Isum_max = 0
For p = 0 to (P - 1) (
    If Isum_p > Isum_max (
        Isum_max = Isum_p
    )
)
I_Cin,pp = Iin - Isum_max
//Calculate peak-to-peak input voltage ripple
dV_sum1 = 0
For p = 0 to (P - 1) (
    dV_sum1 = dV_sum1 + (T_s / (Cin * P)* (Isum_p - Iin)
    dV_sum2 = dV_sum1 + ESR_Cin * (Isum_p - Iin)
    If (p = 0) or (dV_sum2 > dV_sum2_max) (
        //Update maximum sum
        dV_sum2_max = dV_sum2
    )
    If (p = 0) or (dV_sum2 < dV_sum2_min) (
        // Update minimum sum
        dV_sum2_min = dV_sum2
    )
)
V_Cin,pp = dV_sum2_max - dV_sum2_min
//Calculate input capacitor ripple RMS current
I_Cin,rms = sqrt(I²_Cin, min /P)
//Calculate input RMS voltage ripple
V_Cin,rms = I_Cin,rms * (ESR_Cin + T_s / C_in)
```

Referring again to FIG. 5, once the switching phase offsets for all of the converters 200-1 to 200N have been determined in the manner described above, the process proceeds to step S60, wherein the output signal generator 540 generates one or more output signals that define the calculated switching phase offsets to be applied for the switching of the respective switching elements. On the basis of these output signals, the controller 500 generates control signals defining the calculated switching phase offsets to cause the calculated switching phase offsets to be applied to the switching of the respective switching elements. These control signals are then transmitted to the voltage converters 200-1 to 200-N via the control signal bus 600, received by the voltage converters via their respective I/O interfaces 220, and processed by their respective processors 210 such that each voltage converter sets the phase offset of its switching to the respective calculated value.

In the present embodiment, the rank determining module 520, switching phase offset calculator 530, and output signal generator 540 together function as a switching phase regulator 550, as noted above, and respond to changes in the estimated contributions to Vripple from the converters by recalculating the switching phase offsets and generating control signals corresponding to the recalculated switching phase offsets during operation of the power supply system 100.

Second Embodiment

Figure 10:
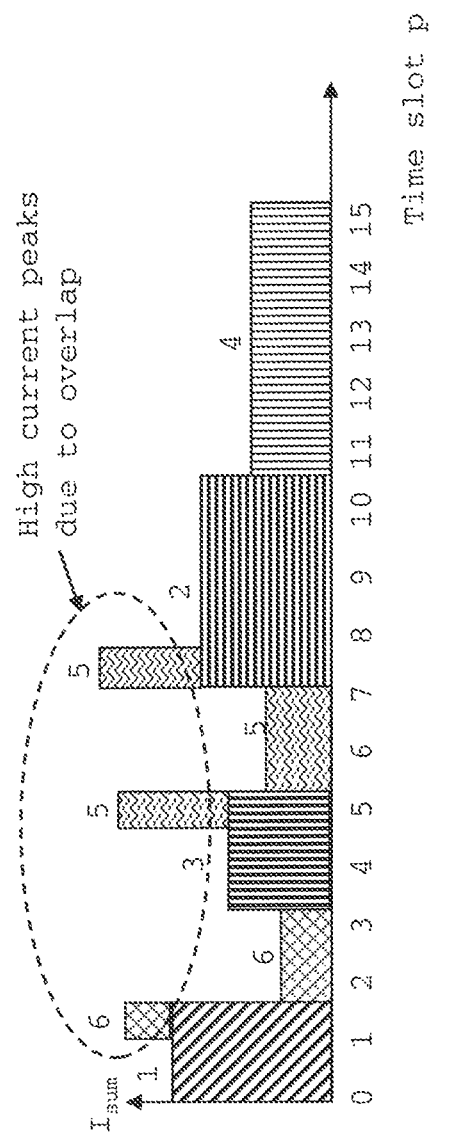
FIG. 10 illustrates an arrangement of switching times of six voltage converters, which gives rise to high current peaks in the switching period.

The algorithm used in the first embodiment, which evaluates an estimate of the peak-to-peak input voltage ripple, $V_{Cin,pp}$, performs well in cases where there is a relatively small number of voltage converters 200-1 to 200-N in the power supply system 100 and/or where the converters' switching duty cycles are small, such that little or no overlap occurs between the "high" portions of their switching cycle once these have been positioned within a switching period $T_s$ by the algorithm. With $V_{Cin,pp}$ as the minimization target in the algorithm, these portions tend to be positioned in the middle of "gaps" between the already positioned portions of higher-ranking voltage converters. However, in cases where there is a large number of voltage converters in the system, this approach leads to overlaps between adjacent portions, resulting in undesirable peaks in the input current, as illustrated in FIG. 10.

In the second embodiment, the respective switching phase offsets of the voltage converters are set so as to reduce not only the input voltage ripple, but also the input current ripple. A high current ripple causes high levels of radiated emissions, increases the power dissipation and puts strain on the input capacitors. Larger and more expensive capacitors may consequently be required to handle the current ripple. On the other hand, keeping the peak-to-peak input voltage ripple low is the very purpose of the input capacitance, and is desirable in order to achieve good regulation of the power supply system's output voltage.

A switching phase offset controller according to a second embodiment will now be described with reference to FIGS. 11 to 13, in which like reference signs designate like components and procedures of the first embodiment described above.

Figure 11:
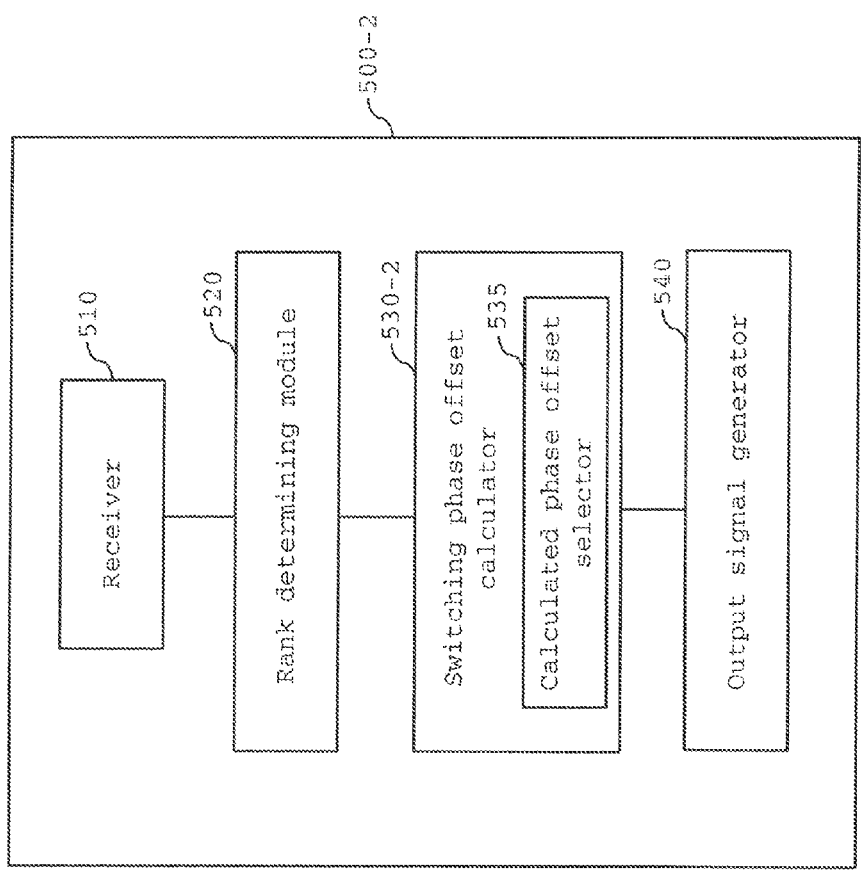
FIG. 11 illustrates functional components of the switching phase offset controller according to a second embodiment of the invention.

FIG. 11 shows key function components of the switching phase offset controller 500-2 of the second embodiment, which may form part of a power supply system that is the same as in the first embodiment illustrated in FIG. 2. Controller 500-2 may be thus provided as a stand-alone hardware component, or may be integrated as part of an on-board controller, the IBC 700 or one of the voltage converters 200-1 to 200-N shown in FIG. 2, or as part of an off-board controller.

The switching phase offset controller 500-2 of the present embodiment comprises a receiver 510, a rank determining module 520, a switching phase offset calculator 530-2, and an output signal generator 540, which are functionally inter-connected as shown in FIG. 11. In the present embodiment, the receiver 510, rank determining module 520, and the output signal generator 540 are the same as in the first embodiment, and the description of these common components will not be repeated here. However, the switching phase offset calculator 530-2 differs from the switching phase offset calculator 530 of the first embodiment, partly by comprising a phase offset selector 535, whose functionality will be described in detail below.

Similar to the first embodiment, the switching phase offset controller 500-2 of the present embodiment may be implemented in programmable signal processing hardware of the kind described above with reference to FIG. 4. The combination 870 of the hardware components shown in FIG. 4, comprising the processor 820, the working memory 830 and the instruction store 840, may be configured to implement the functionality of the rank determining module 520, switching phase offset calculator 530-2 and output signal generator 540 of the present embodiment.

Figure 12:
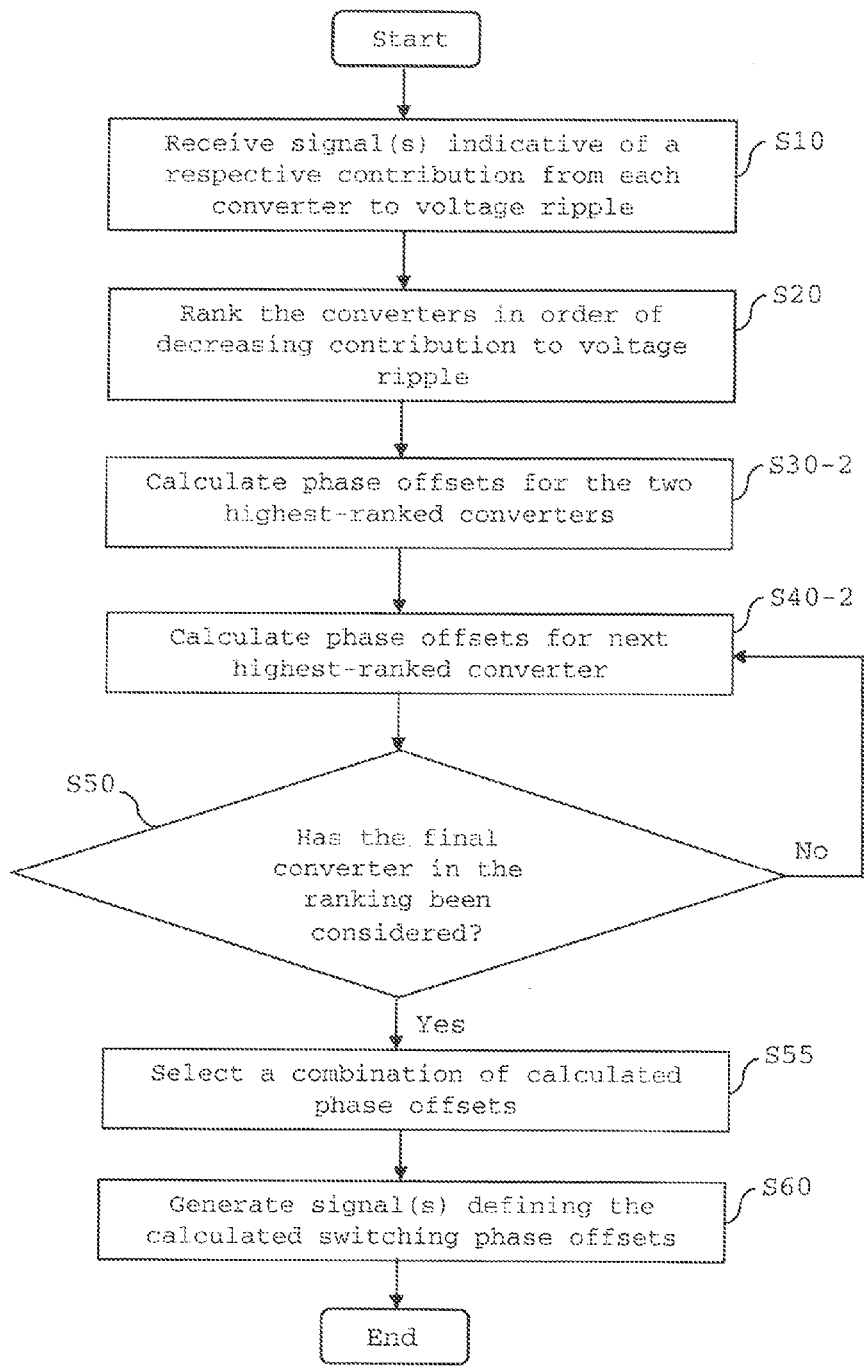
FIG. 12 is a flow diagram illustrating a method of controlling the distribution of switching phase offsets in the second embodiment.

FIG. 12 is a flow chart illustrating a process by which the controller 500-2 of the present embodiment controls the distribution of switching phase offsets in the power supply system 100.

Steps S10 and S20 are the same as those described above with reference to FIG. 5, and the operations performed by the controller 500-2 at these stages of the process will therefore not be described again here.

Once the voltage converters 200-1 to 200-N have been ranked in step S20, the switching phase calculator 530-2 calculates a respective switching phase offset that is to be applied for the switching element in each of the voltage converters 200-1 to 200-N. The overall process of calculating these phase offset values is described below, and is based on values of the input voltage Vin, output voltage $Vout_k$, estimated nominal output current, and the efficiency $\eta_k$, of each converter 200-$k$ (for k=1 to N). The calculation method described below is not, however, limited to using nominal output current values of the converters, and may instead be based on maximum or minimum values of the respective output currents.

The calculations begin in step S30-2, wherein the switching phase calculator 530-2 preferably sets the phase of the highest-ranked converter to an arbitrary value (e.g. zero), and then calculates a plurality of phase offsets (with respect to the common synchronisation clock) for the second highest ranked voltage converter. Each of this plurality of phase offsets is such that it would yield an input voltage ripple, caused only by the two highest ranked voltage converters (i.e. an input voltage ripple which would occur if only those two highest-ranked voltage converters were present in the power supply system), which is below a threshold value, wherein at least one of the plurality of phase offsets would minimise the input voltage ripple caused only by the two highest ranked voltage converters. In other words, the switching phase calculator 530-2 calculates not only a phase offset of the second converter that would minimise the input voltage ripple due only to the two highest-ranked voltage converters (as in the first embodiment), but also at least one further phase offset value for the second voltage converter, which may or may not also minimise the aforementioned input current ripple but which, in any event, yields an input voltage ripple (due to the two highest-ranked voltage converters only) that is smaller than a predetermined threshold value.

Then, in step S40-2, the switching phase calculator 530-2 similarly calculates, for the next-highest ranked voltage converter (at this stage, the third converter in the list), a respective plurality of phase offsets, each of which would yield an input voltage ripple, caused only by said next-highest ranked voltage converter and the voltage converters ranked higher than said next-highest voltage converter (at this stage, by the three highest-ranked converters only), which is below a threshold value, wherein at least one of the plurality of phase offsets for the next-highest ranked (third) voltage converter would minimise the input voltage ripple caused only by said next-highest ranked voltage converter and the voltage converters ranked higher than said next-highest voltage converter. Although the threshold value in step S40-2 is the same as the threshold value in step S30-2 in the present embodiment, these threshold values may, in general, be different each time step S40-2 is performed.

In step S50, the switching phase calculator 530-2 determines whether the phase offset for the final voltage converter in the ranking/list has been calculated and, if not, repeats the calculation in step S40-2 for the next voltage converter in the ranking generated at step S20. Thus, in the next performance of step S40-2, the switching phase offset calculator 530-2 calculates a plurality of phase offsets for the next-highest ranked voltage converter (i.e. the fourth converter identified in the list), each of which would yield an input voltage ripple, caused only by the next-highest ranked (fourth) voltage converter and the voltage converters ranked higher than the next-highest voltage converter, which is below a threshold value, wherein at least one of the plurality of phase offsets for the next-highest ranked voltage converter would minimise the input voltage ripple caused only by said next-highest ranked voltage converter and the voltage converters ranked higher than said next-highest voltage converter.

Figure 13:
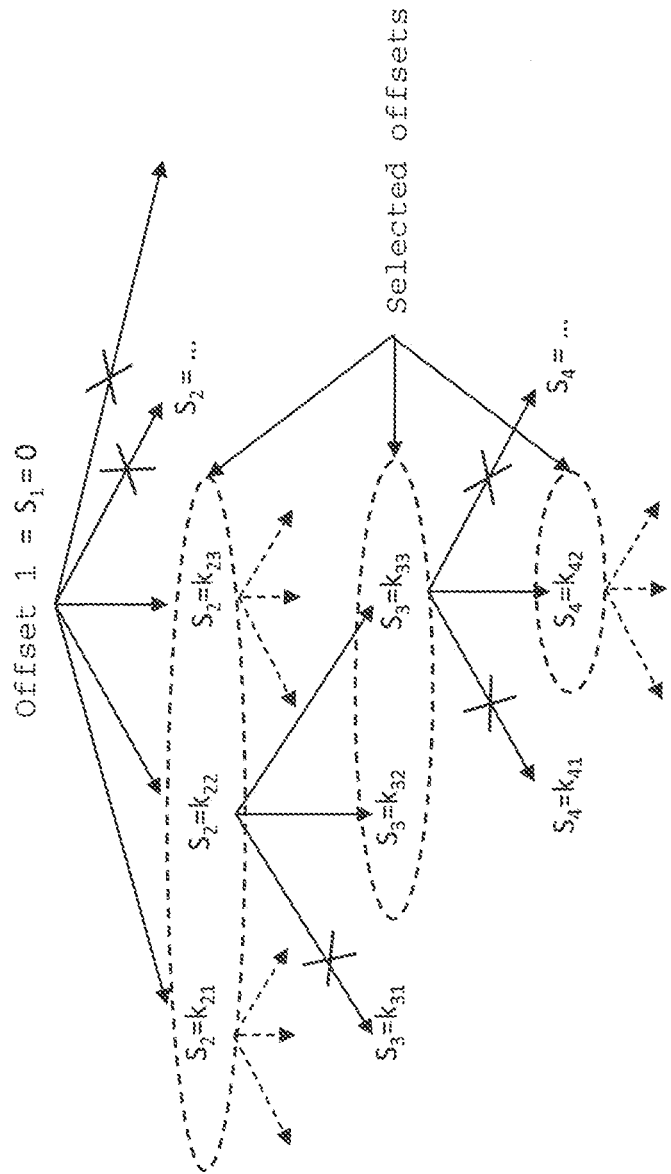
FIG. 13 illustrates the tree structure used in the second embodiment.
Figure 14:
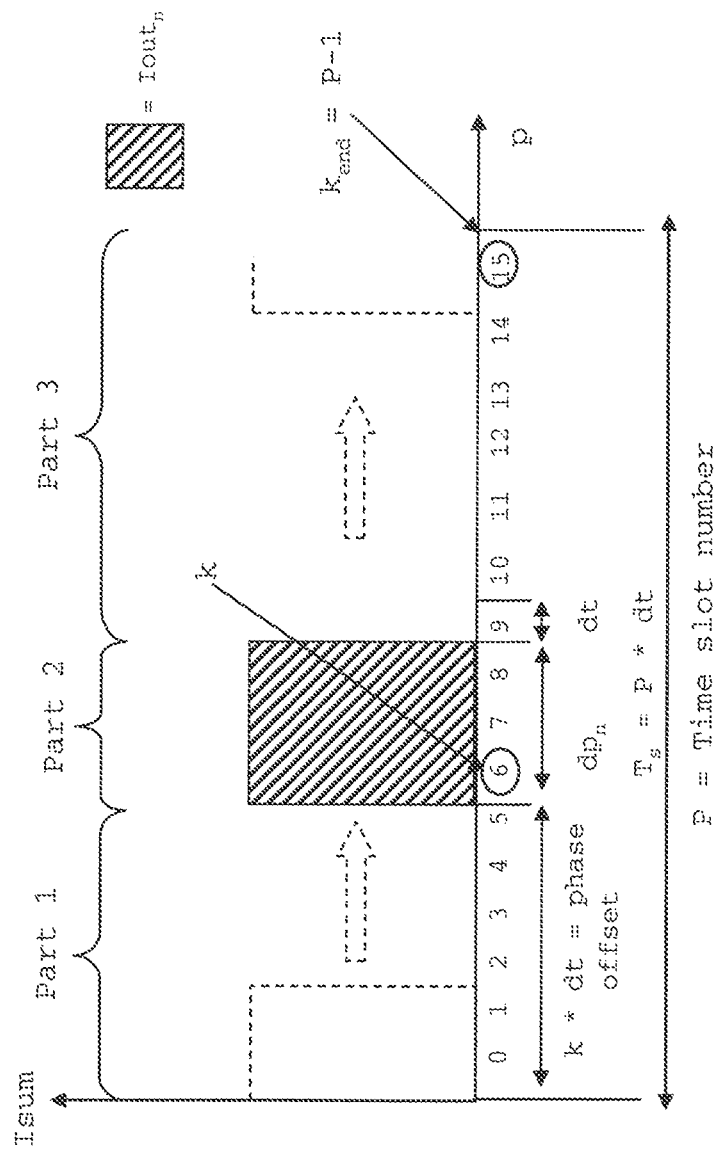
FIG. 14 illustrates the process of shifting the switching phase of converter n during calculation of the converter's optimum phase offset in a modification of the first embodiment, where phase offset wrap-around is used.

Through this process of repeating step S40-2, with each repetition calculating a plurality of near-optimal candidate phase offsets for the next voltage converter in the ranking, the switching phase calculator 530-2 can be considered to build up a "tree structure" of candidate phase offset values, for example as illustrated in FIG. 13, wherein the plurality of nodes at each level (row) of the tree structure contain respective values ($k_{m1}$, $k_{m2}$, $k_{m3}$, etc.) of phase offsets that have been calculated during the performance of step S40-2 for a voltage converter m in the ranking/list that is associated with that level/row. It should be noted that all of the phase offset values that appear at any given level of the tree structure have been found during their calculation to be below the threshold value that is associated with the voltage converter corresponding to that level. For example, the offset values $k_{21}$, $k_{22}$ and $k_{23}$ calculated for the second highest-ranked voltage converter are all below the threshold value associated with that converter, and are therefore selected during the calculation process to remain in the tree structure. In this way, some branches of the tree are effectively "pruned" while others are kept, as illustrated in FIG. 13. This branch pruning process limits the numbers of the phase offsets at each tree level that need to be considered in the subsequent calculations that are performed by the phase offset selector 535, as described below.

In contrast to the present embodiment, the process of repeating step S40 in the first embodiment described above can be considered to yield a single path down through the tree structure of FIG. 13, which path comprises only the nodes (one provided at each tree level) that contain respective phase offset values which would minimise input voltage ripple.

Once all of the voltage converters in the power supply system have been considered and a respective set of phase offset values has been calculated for each of the voltage converters, the process proceeds to step S55. In step S55, the phase offset selector 535 calculates, for each of a plurality of combinations of phase offsets, wherein each combination comprises a respective phase offset for each of the plurality of voltage converters, an indicator value that is indicative of an input current ripple that would be caused by operation of the plurality of voltage converters 200-1 to 200-N when configured to switch their switching elements in accordance with respective values of phase offsets in the combination of calculated phase offsets. The phase offset selector 535 then selects a combination of phase offsets that gives the lowest calculated indicator value.

In other words, in step S55, the phase offset selector 535 calculates, for each combination of phase offsets (which may be regarded as one of the possible paths down through the tree structure, starting from the node associated with the highest-ranked converter and continuing to one of the nodes associated with the lowest-ranked converter, via a selection of intervening nodes, one at each level of the tree structure), a value indicative of an input current ripple that would be caused by operation of the plurality of voltage converters 200-1 to 200-N when configured to switch their switching elements in accordance with respective values of phase offsets as contained in the nodes of the path through the tree structure. Thus, each path through the tree structure may be considered to represent a possible configuration of the voltage converters 200-1 to 200-N, wherein each of the voltage converters 200-1 to 200-N is provided with a respective phase offset as specified at the respective node in the tree structure.

The indicator value may be derived from any function whose evaluation yields a measure of the input current ripple, for example the expression for $I_{Cin,rms}$ in Eqn. 5 or a simplified form thereof (e.g. with $T_s$ set equal to 1), or an expression for the peak-to-peak input current ripple, $I_{Cin,pp}$.

Once the indicator value has been calculated for each available path through the tree structure (or for a selection of only some of the available paths), the phase offset selector 535 selects the path that gives the lowest of the calculated indicator values.

It will be appreciated from the foregoing that, by keeping track of the most promising candidate phase offsets at each level of the tree structure (namely, those lying below the aforementioned thresholds), it is possible to effectively "cut" branches of the tree before they reach their ends, thereby reducing the complexity of the process performed by the phase offset selector 535 in step S55 to select the best combination of switching phase offsets, according to which the voltage converters 200-1 to 200-N are to be configured.

The complexity of the algorithm varies as the product of P and the number of nodes in the tree structure, and is a function of the number N of voltage converters in the system, $Iout_n$ and $dp_n$. The complexity may be expressed approximately as $$\sum_{n=0}^{N} m^n P^{(n+1)},$$

where m is a number in the range between 0 and 1 representing the fraction of nodes kept at each tree level. From this, it can be seen that the complexity may, in principle, rise to a level that is difficult to handle in practice (similar to the case where all possible phase offset configurations are evaluated, as explained above with reference to FIG. 9). It is therefore preferable to limit the number of nodes kept at each tree level, for example by appropriately setting the aforementioned threshold used in steps S30-2 and S40-2 of the algorithm and/or setting the number of phase offset values kept at each tree level to an appropriate value.

Once the combination of switching phase offsets been selected in the manner described above, the process proceeds to step S60, wherein the output signal generator 540 generates one or more output signals that define the switching phase offsets from the selected combination that are to be applied for the switching of the respective switching elements. On the basis of these output signals, the controller 500-2 generates control signals defining the selected set of switching phase offsets to cause these switching phase offsets to be applied to the switching of the respective switching elements. These control signals are then transmitted to the voltage converters 200-1 to 200-N via the control signal bus 600, received by the voltage converters via their respective I/O interfaces 220, and processed by their respective processors 210 such that each voltage converter sets the phase offset of its switching to the respective value.

Modifications and Variants

Many modifications and variations can be made to the embodiments, without departing from the scope of the present invention.

For example, in the above-described embodiments and modifications thereof, the output current $Iout_k$, output voltage $Vout_k$ and/or the duty cycle $D_k$ of a converter are taken to provide an indication of the contribution from converter 200-k to the input voltage ripple. However, the converters 200-1 to 200-N may be ranked on the basis of other indictors of this contribution. For example, in a yet further embodiment, the receiver 510 may be configured to receive, as the one or more signals indicative of the contribution from each of the voltage converters 200-1 to 200-N to the voltage ripple, one or more signals that are indicative of a product of a respective output current $Iout_k$, and one of: (i) the respective output voltage $Vout_k$; and (ii) a respective switching duty cycle $D_k$, of each voltage converter 200-$k$ when each voltage converter is arranged to supply power to a respective load. In this variant, the rank determining module 520 is configured to rank the voltage converters 200-1 to 200-N in order of decreasing values of said product, i.e. $Iout_k \cdot Vout_k$ or $Iout_k \cdot D_k$, as the case may be.

Furthermore, in an alternative embodiment briefly mentioned above, the signals received by the receiver 510 at step S10 may convey estimated (rather than measured) values of the respective output current $Iout_k$ and output voltage $Vout_k$ (or duty cycle $D_k$) of each voltage converter 200-$k$, which are predicted to occur during operation of the power supply system 100. In this alternative embodiment, the expected values of these parameters may be transmitted to the controller 500 by a user via a user interface (e.g. a guided user interface (GUI) on a display such as an LCD monitor) during configuration of the power supply system 100, for example at the factory or on-site during installation. The rank determining module 520 and the switching phase offset calculator 530 of this embodiment then perform the operations described above to calculate the phase offset values, and the output signal generator 540 generates signals defining the calculated phase offset values, for output to the user interface. In this way, the user of the power supply system 100 may view the calculated phase offset values on a display, and set the converters 200-1 to 200-N to operate in accordance with the respective phase offset values; this could be done by e.g. issuing appropriate commands to the controller 500 via the user interface, or by directly configuring each converter in turn, using the INTERLEAVE command offered in PMBus Specification v1.2, for example.

The power supply system described above takes the exemplary form of an IBA power system, although it will be appreciated that the switching phase offset control techniques described herein are applicable to other types of power supply system having multiple switching voltage converters that switch at a common switching frequency to convert an input voltage into respective output voltages. For example, although each of the voltage converters in the above-described embodiments is stand-alone buck converter in the form of an SMPS, it will be appreciated that, in alternative embodiments, the power supply system may have, instead of or in addition to such stand-alone converters, one or more SMPSs each comprising multiple voltage converters of the aforementioned most general form (as in the case of a multiphase buck converter, for example).

The pseudo code describing the algorithm of the first embodiment above may be modified in various ways.

Figure 15:
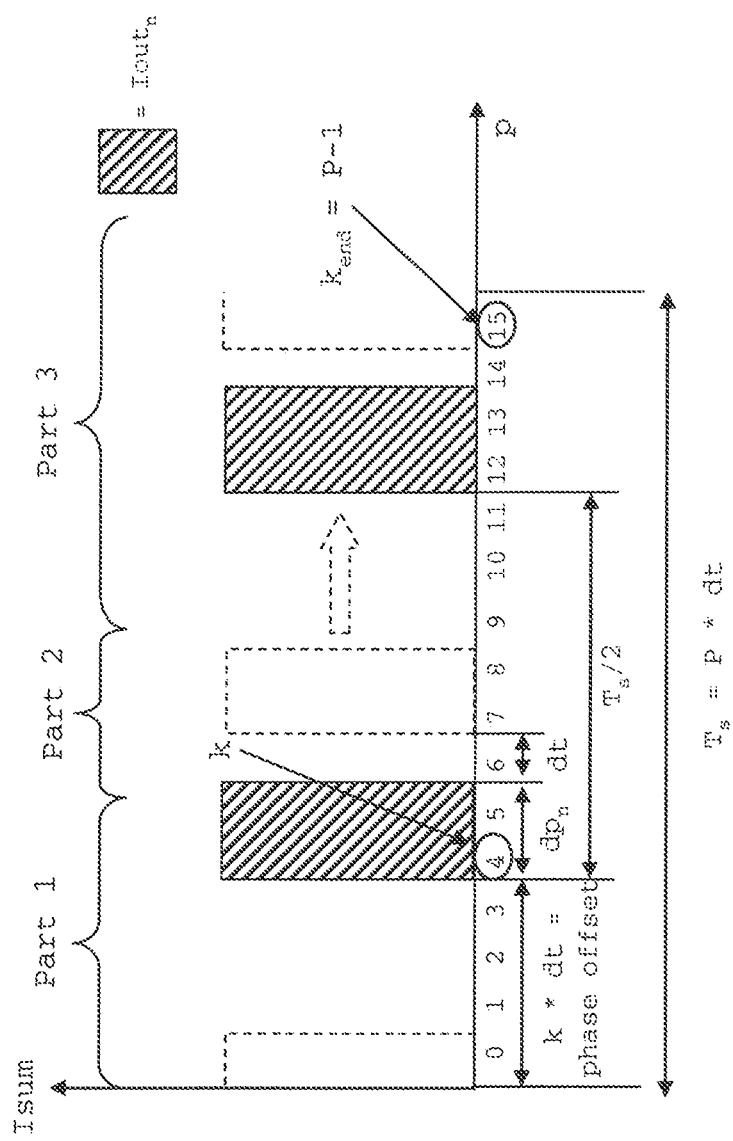
FIG. 15 illustrates how the presence of two parallel voltage converters in the power supply system is catered for in a modification of the first embodiment.

For example, in the pseudo code of the first embodiment, phase offset positions are evaluated from k=0 to $k_{end}$, where $k_{end}=P-dp_n$. However, as the switching period is a cyclically reoccurring period of time, the turn-on period of a voltage converter (i.e. the above-mentioned "high" portion of the converter's switching cycle) may be considered in the calculation at all positions from k=0 to P-1, i.e. $k_{end}=P-1$. Thus, the turn-on period may be allowed to wrap around to the next switching period. This may allow better utilization of the whole switching period and a more effective phase offset distribution. This "wrap-around" of the switching phase offset is illustrated in FIG. 15, which may be compared with FIG. 8 (where, as noted above, the phase offset positions are evaluated from k=0 to $k_{end}$, where $k_{end}=P-dp_n$).

Furthermore, the algorithm described above may be adapted for use with power supply systems in which the outputs of two or more voltage converters are connected together to supply a single output voltage to a load. In power supply systems of this kind, the phase offsets between the parallel voltage converters are usually restricted. For example, a parallel arrangement of three converters is usually required to have a 120° offset (⅓ of the switching period) between the individual converters. In the modified algorithm, such parallel converters may be handled as a single converter whose turn-on period is spread into pieces across the switching period $T_3$, as illustrated in FIG. 16. In this example, the turn-on periods of the two converters are offset by 180°.

In the second embodiment, the phase offset selector 535 makes its selection from the available paths in the tree structure (each representing a combination/configuration of converter phase offsets) by selecting a path whose phase offset values minimize the input current ripple. However, other selection criteria may alternatively be used. For example, in an alternative embodiment, the phase offset selector 535 may calculate, for each of the aforementioned combinations of phase offsets, an indicator value that is indicative of an input voltage ripple that would be caused by operation of the plurality of voltage converters 200-1 to 200-N when configured to switch their switching elements in accordance with respective values of phase offsets in the combination of calculated phase offsets, and select a combination of phase offsets that gives the lowest of the calculated indicator values.

As a further alternative, the phase offset selector 535 may be arranged to: (i) calculate, for each of a plurality of combinations of phase offsets, both a first indicator value that is indicative of an input voltage ripple, and a second indicator value that is indicative of an input current ripple that would be caused by operation of the plurality of voltage converters 200-1 to 200-N when configured to switch their switching elements in accordance with respective values of phase offsets in the combination of calculated phase offsets; and (ii) select a combination of phase offsets that gives the lowest value of the product of the calculated first and second indicator values, e.g. $V_{pp}I^2_{Cin}$.

The foregoing description of embodiments of the present invention has been presented for the purpose of illustration and description. It is not intended to be exhaustive or to limit the invention to the present form disclosed. Alternations, modifications and variations can be made without departing from the spirit and scope of the present invention.

The invention claimed is:

1. A controller for determining a distribution of switching phases among switching elements of a power supply system, the power supply system comprising a plurality of voltage converters, wherein each voltage converter comprises a switching element and is arranged to convert an input voltage supplied to the voltage converters to a respective output voltage by switching the switching element at a predetermined switching frequency, the controller comprising:

a receiver for receiving one or more signals indicative of a respective contribution from each of the voltage converters to a ripple voltage component of the input voltage supplied to the voltage converters;

a rank determining module configured to rank the voltage converters in order of decreasing contribution to the ripple voltage;

a switching phase offset calculator configured to calculate a respective switching phase offset that is to be applied for the switching element in each of the voltage converters by:
  (i) calculating respective phase offsets of two highest ranked voltage converters that would minimise an input voltage ripple caused only by said two highest ranked voltage converters;
  (ii) calculating a phase offset of a next-highest ranked voltage converter that would minimise an input voltage ripple caused only by said next-highest ranked voltage converter and voltage converters ranked higher than said next-highest voltage converter; and
  (iii) repeating step (ii) for each subsequent voltage converter in the ranking; and
an output signal generator configured to generate one or more output signals defining the calculated switching phase offsets to be applied to the switching of the respective switching elements.

2. The controller according to claim 1, wherein:
the receiver is configured to receive, as the one or more signals indicative of the respective contribution from each of the voltage converters to the ripple voltage, one or more signals indicative of a respective output current of each voltage converter; and
the rank determining module is configured to rank the voltage converters in order of decreasing output current.

3. The controller according to claim 2, wherein:
the one or more signals received by the receiver are further indicative of values of a parameter being one of:
  a respective duty cycle according to which the switching element in each voltage converter is switched; and
  the respective output voltage of each voltage converter; and
wherein at least two of the voltage converters have a same output current, the rank determining module is configured to further rank said at least two voltage converters in order of decreasing values of the parameter.

4. The controller according to claim 1, wherein:
the receiver is configured to receive, as the one or more signals indicative of the contribution from each of the voltage converters to the ripple voltage, one or more signals that are indicative of values of a parameter being one of:
  a respective duty cycle according to which the switching element in each voltage converter is switched; and
  the respective output voltage of each voltage converter; and
the rank determining module is configured to rank the voltage converters in order of decreasing values of the parameter.

5. The controller according to claim 4, wherein:
the one or more signals received by the receiver are further indicative of a respective output current of each voltage converter; and
wherein at least two of the voltage converters have a same value of the parameter, the rank determining module is configured to further rank said at least two voltage converters in order of decreasing output current.

6. The controller according to claim 1, wherein:
the receiver is configured to receive, as the one or more signals indicative of the contribution from each of the voltage converters to the ripple voltage, one or more signals that are indicative of a product of a respective output current, and one of the respective output voltage and a respective switching duty cycle, of each voltage converter; and
the rank determining module is configured to rank the voltage converters in order of decreasing values of said product.

7. A controller for controlling a distribution of switching phases among switching elements of a power supply system, the power supply system comprising a plurality of voltage converters, wherein each voltage converter comprises a switching element and is arranged to convert an input voltage supplied to the voltage converters to a respective output voltage by switching the switching element at a predetermined switching frequency, the controller comprising:
a receiver for receiving one or more signals indicative of a respective contribution from each of the voltage converters to a ripple voltage component of the input voltage supplied to the voltage converters; and
a switching phase offset regulator for regulating switching phase offsets of the switching elements during operation of the power supply system, the switching phase offset regulator comprising:
  a switching phase offset calculator configured to calculate, based on the received signal(s), a respective switching phase offset that is to be applied for the switching element in each of the voltage converters, the switching phase offsets being calculated so as to substantially minimise the ripple voltage component; and
  a control signal generator configured to generate one or more control signals defining the calculated switching phase offsets to be applied to the switching of the respective switching elements,
wherein the switching phase offset regulator is responsive to changes in the received signal(s) to recalculate the switching phase offsets and generate control signals corresponding to the recalculated switching phase offsets during operation of the power supply system.

8. The controller according to claim 7, wherein:
the switching phase offset calculator is arranged to:
  (i) calculate a plurality of phase offsets for a second highest ranked voltage converter, each of which would yield an input voltage ripple, caused only by two highest ranked voltage converters, which is below a threshold value, wherein at least one of the plurality of phase offsets would minimise an input voltage ripple caused only by the two highest ranked voltage converters;
  (ii) calculate, for a next-highest ranked voltage converter, a respective plurality of phase offsets, each of which would yield an input voltage ripple, caused only by said next-highest ranked voltage converter and the voltage converters ranked higher than said next-highest voltage converter, which is below a threshold value, wherein at least one of the plurality of phase offsets for the next-highest ranked voltage converter would minimise an input voltage ripple caused only by said next-highest ranked voltage converter and the voltage converters ranked higher than said next-highest voltage converter; and
  (iii) repeat step (ii) for each subsequent voltage converter in the ranking;
the switching phase offset calculator comprises a phase offset selector arranged to calculate, for each of a plurality of combinations of phase offsets, wherein each combination comprises a respective phase offset for each of the plurality of voltage converters, an indicator value that is indicative of an input current ripple that would be caused by operation of the plurality of voltage converters when configured to switch their switching elements in accordance with respective values of phase offsets in the combination of calculated phase offsets, and to select a combination of phase offsets that gives a lowest calculated indicator value; and an output signal generator is configured to generate one or more output signals in accordance with the selected combination of switching phase offsets.

9. The controller according to claim 1, wherein:
the switching phase offset calculator is arranged to:
  (i) calculate a plurality of phase offsets for a second highest ranked voltage converter, each of which would yield an input voltage ripple, caused only by two highest ranked voltage converters, which is below a threshold value, wherein at least one of the plurality of phase offsets would minimise an input voltage ripple caused only by the two highest ranked voltage converters;
  (ii) calculate, for a next-highest ranked voltage converter, a respective plurality of phase offsets, each of which would yield an input voltage ripple, caused only by said next-highest ranked voltage converter and voltage converters ranked higher than said next-highest voltage converter, which is below a threshold value, wherein at least one of the plurality of phase offsets for the next-highest ranked voltage converter would minimise an input voltage ripple caused only by said next-highest ranked voltage converter and the voltage converters ranked higher than said next-highest voltage converter; and
  (iii) repeat step (ii) for each subsequent voltage converter in the ranking;
the switching phase offset calculator comprises a phase offset selector arranged to calculate, for each of a plurality of combinations of phase offsets, wherein each combination comprises a respective phase offset for each of the plurality of voltage converters, an indicator value that is indicative of an input voltage ripple that would be caused by operation of the plurality of voltage converters when configured to switch their switching elements in accordance with respective values of phase offsets in the combination of calculated phase offsets, and to select a combination of phase offsets that gives a lowest calculated indicator value; and
an output signal generator configured to generate one or more output signals in accordance with the selected combination of switching phase offsets.

10. The controller according to claim 7, wherein:
the switching phase offset calculator is arranged to:
  (i) calculate a plurality of phase offsets for a second highest ranked voltage converter, each of which would yield an input voltage ripple, caused only by two highest ranked voltage converters, which is below a threshold value, wherein at least one of the plurality of phase offsets would minimise an input voltage ripple caused only by the two highest ranked voltage converters;
  (ii) calculate, for a next-highest ranked voltage converter, a respective plurality of phase offsets, each of which would yield an input voltage ripple, caused only by said next-highest ranked voltage converter and voltage converters ranked higher than said next-highest voltage converter, which is below a threshold value, wherein at least one of the plurality of phase offsets for the next-highest ranked voltage converter would minimise an input voltage ripple caused only by said next-highest ranked voltage converter and the voltage converters ranked higher than said next-highest voltage converter; and
  (iii) repeat step (ii) for each subsequent voltage converter in the ranking;
the switching phase offset calculator comprises a phase offset selector arranged to:
  calculate, for each of a plurality of combinations of phase offsets, wherein each combination comprises a respective phase offset for each of the plurality of voltage converters, both a first indicator value that is indicative of an input voltage ripple, and a second indicator value that is indicative of an input current ripple that would be caused by operation of the plurality of voltage converters when configured to switch their switching elements in accordance with respective values of phase offsets in the combination of calculated phase offsets; and
  select a combination of phase offsets that gives a lowest value of a product of the calculated first and second indicator values; and
an output signal generator is configured to generate one or more output signals in accordance with the selected combination of switching phase offsets.

11. A power supply system, comprising:
a plurality of voltage converters, wherein each voltage converter comprises a switching element and is arranged to convert an input voltage supplied to the voltage converters to a respective output voltage by switching the switching element at a predetermined switching frequency; and
a controller for determining a distribution of switching phases among the switching elements, the controller comprising:
a receiver for receiving one or more signals indicative of a respective contribution from each of the voltage converters to a ripple voltage component of the input voltage supplied to the voltage converters;
a rank determining module configured to rank the voltage converters in order of decreasing contribution to the ripple voltage;
a switching phase offset calculator configured to calculate a respective switching phase offset that is to be applied for the switching element in each of the voltage converters by:
  (i) calculating respective phase offsets of two highest ranked voltage converters that would minimise an input voltage ripple caused only by said two highest ranked voltage converters;
  (ii) calculating a phase offset of a next-highest ranked voltage converter that would minimise an input voltage ripple caused only by said next-highest ranked voltage converter and voltage converters ranked higher than said next-highest voltage converter; and
  (iii) repeating step (ii) for each subsequent voltage converter in the ranking; and
an output signal generator configured to generate one or more output signals defining the calculated switching phase offsets to be applied to the switching of the respective switching elements.

12. In a power supply system comprising a plurality of voltage converters, wherein each voltage converter comprises a switching element and is arranged to convert an input voltage supplied to the voltage converters to a respective output voltage by switching the switching element at a predetermined switching frequency, a method of determining a distribution of switching phases among the switching elements, comprising:
- receiving one or more signals indicative of a respective contribution from each of the voltage converters to a ripple voltage component of the input voltage supplied to the voltage converters;
- ranking the voltage converters in order of decreasing contribution to the ripple voltage;
- calculating a switching phase offset that is to be applied for the switching element in each of the voltage converters by:
  - (i) calculating respective phase offsets of two highest ranked voltage converters that would minimise an input voltage ripple caused only by said two highest ranked voltage converters;
  - (ii) calculating a phase offset of a next-highest ranked voltage converter that would minimise an input voltage ripple caused only by said next-highest ranked voltage converter and voltage converters ranked higher than said next-highest voltage converter; and
  - (iii) repeating step (ii) for each subsequent voltage converter in the ranking; and
- generating one or more signals that define the calculated switching phase offsets to be applied to the switching of the respective switching elements.

13. The method according to claim 12, wherein:
- receiving the one or more signals indicative of the contribution from each of the voltage converters to the ripple voltage comprises receiving one or more signals indicative of a respective output current of each voltage converter; and
- the voltage converters are ranked in order of decreasing output current.

14. The method according to claim 13, wherein:
- the received one or more signals are further indicative of values of a parameter being one of:
  - a respective duty cycle according to which the switching element in each voltage converter is switched; and
  - the respective output voltage of each voltage converter; and
- wherein at least two of the voltage converters have a same output current, said at least two voltage converters are further ranked in order of decreasing values of the parameter.

15. The method according to claim 12, wherein:
- receiving the one or more signals indicative of the contribution from each of the voltage converters to the ripple voltage comprises receiving one or more signals that are indicative of values of a parameter being one of:
  - a respective duty cycle according to which the switching element in each voltage converter is switched; and
  - the respective output voltage of each voltage converter; and
- the voltage converters are ranked in order of decreasing values of the parameter.

16. The method according to claim 15, wherein:
- the received one or more signals are further indicative of a respective output current of each voltage converter; and
- wherein at least two of the voltage converters have a same value of the parameter, said at least two voltage converters are further ranked in order of decreasing output current.

17. The method according to claim 12, wherein:
- receiving the one or more signals indicative of the contribution from each of the voltage converters to the ripple voltage comprises receiving one or more signals that are indicative of a product of a respective output current, and one of the respective output voltage and a respective switching duty cycle, of each voltage converter; and
- the voltage converters are ranked in order of decreasing values of said product.

18. In a power supply system comprising a plurality of voltage converters, wherein each voltage converter comprises a switching element and is arranged to convert an input voltage supplied to the voltage converters to a respective output voltage by switching the switching element at a predetermined switching frequency, a method of controlling a distribution of switching phases among the switching elements, the method comprising:
- receiving one or more signals indicative of a respective contribution from each of the voltage converters to a ripple voltage component of the input voltage supplied to the voltage converters; and
- regulating switching phase offsets of the switching elements during operation of the power supply system by:
  - calculating, based on the received signal(s), a respective switching phase offset that is to be applied for the switching element in each of the voltage converters, the switching phase offsets being calculated so as to substantially minimise the ripple voltage component; and
  - generating one or more control signals defining the calculated switching phase offsets to cause the calculated switching phase offsets to be applied to the switching of the respective switching elements,
- wherein the switching phase offsets are recalculated in response to changes in the received signal(s), and one or more control signals corresponding to the recalculated switching phase offsets are generated during operation of the power supply system.

19. The method according to claim 18, wherein the switching phase offset that is to be applied for the switching element in each of the voltage converters is calculated by:
- (i) calculating a plurality of phase offsets for a second highest ranked voltage converter, each of which would yield an input voltage ripple, caused only by two highest ranked voltage converters, which is below a threshold value, wherein at least one of the plurality of phase offsets would minimise an input voltage ripple caused only by the two highest ranked voltage converters;
- (ii) calculating, for a next-highest ranked voltage converter, a respective plurality of phase offsets, each of which would yield an input voltage ripple, caused only by said next-highest ranked voltage converter and voltage converters ranked higher than said next-highest voltage converter, which is below a threshold value, wherein at least one of the plurality of phase offsets for the next-highest ranked voltage converter would minimise an input voltage ripple caused only by said next-highest ranked voltage converter and the voltage converters ranked higher than said next-highest voltage converter;
- (iii) repeating step (ii) for each subsequent voltage converter in the ranking;
- calculating, for each of a plurality of combinations of phase offsets, wherein each combination comprises a respective phase offset for each of the plurality of voltage converters, an indicator value that is indicative of an input current ripple that would be caused by operation of the plurality of voltage converters when configured to switch their switching elements in accordance with respective values of phase offsets in the combination of calculated phase offsets, and to select a combination of phase offsets that gives the lowest calculated indicator value; and selecting a combination of phase offsets that gives a lowest calculated indicator value, wherein the one or more signals that define the calculated switching phase offsets to be applied to the switching of the respective switching elements are generated in accordance with the selected combination of switching phase offsets.

20. The method according to claim 12, wherein the switching phase offset that is to be applied for the switching element in each of the voltage converters is calculated by:
  (i) calculating a plurality of phase offsets for a second highest ranked voltage converter, each of which would yield an input voltage ripple, caused only by two highest ranked voltage converters, which is below a threshold value, wherein at least one of the plurality of phase offsets would minimise an input voltage ripple caused only by the two highest ranked voltage converters;
  (ii) calculating, for a next-highest ranked voltage converter, a respective plurality of phase offsets, each of which would yield an input voltage ripple, caused only by said next-highest ranked voltage converter and voltage converters ranked higher than said next-highest voltage converter, which is below a threshold value, wherein at least one of the plurality of phase offsets for the next-highest ranked voltage converter would minimise an input voltage ripple caused only by said next-highest ranked voltage converter and the voltage converters ranked higher than said next-highest voltage converter;
  (iii) repeating step (ii) for each subsequent voltage converter in the ranking;
calculating, for each of a plurality of combinations of phase offsets, wherein each combination comprises a respective phase offset for each of the plurality of voltage converters, an indicator value that is indicative of an input voltage ripple that would be caused by operation of the plurality of voltage converters when configured to switch their switching elements in accordance with respective values of phase offsets in the combination of calculated phase offsets; and selecting a combination of phase offsets that gives the lowest calculated indicator value, wherein the one or more signals that define the calculated switching phase offsets to be applied to the switching of the respective switching elements are generated in accordance with the selected combination of switching phase offsets.

21. The method according to claim 18, wherein the switching phase offset that is to be applied for the switching element in each of the voltage converters is calculated by:
  (i) calculating a plurality of phase offsets for a second highest ranked voltage converter, each of which would yield an input voltage ripple, caused only by two highest ranked voltage converters, which is below a threshold value, wherein at least one of the plurality of phase offsets would minimise an input voltage ripple caused only by the two highest ranked voltage converters;
  (ii) calculating, for a next-highest ranked voltage converter, a respective plurality of phase offsets, each of which would yield an input voltage ripple, caused only by said next-highest ranked voltage converter and voltage converters ranked higher than said next-highest voltage converter, which is below a threshold value, wherein at least one of the plurality of phase offsets for the next-highest ranked voltage converter would minimise an input voltage ripple caused only by said next-highest ranked voltage converter and the voltage converters ranked higher than said next-highest voltage converter;
  (iii) repeating step (ii) for each subsequent voltage converter in the ranking;
calculating, for each of a plurality of combinations of phase offsets, wherein each combination comprises a respective phase offset for each of the plurality of voltage converters, both a first indicator value that is indicative of an input voltage ripple, and a second indicator value that is indicative of an input current ripple that would be caused by operation of the plurality of voltage converters when configured to switch their switching elements in accordance with respective values of phase offsets in the combination of calculated phase offsets; and selecting a combination of phase offsets that gives the lowest value of the product of the calculated first and second indicator values, wherein the one or more signals that define the calculated switching phase offsets to be applied to the switching of the respective switching elements are generated in accordance with the selected combination of switching phase offsets.

22. A non-transitory computer-readable storage medium having computer code stored therein, which when executed by a processor of a power supply system comprising a plurality of voltage converters, wherein each voltage converter comprises a switching element and is arranged to convert an input voltage supplied to the voltage converters to a respective output voltage by switching the switching element at a predetermined switching frequency, cause the power supply system to perform operations for determining a distribution of switching phases among the switching elements, the operations comprising:
  receiving one or more signals indicative of a respective contribution from each of the voltage converters to a ripple voltage component of the input voltage supplied to the voltage converters;
  ranking the voltage converters in order of decreasing contribution to the ripple voltage;
  calculating a switching phase offset that is to be applied for the switching element in each of the voltage converters by:
    (i) calculating respective phase offsets of two highest ranked voltage converters that would minimise an input voltage ripple caused only by said two highest ranked voltage converters;
    (ii) calculating a phase offset of a next-highest ranked voltage converter that would minimise an input voltage ripple caused only by said next-highest ranked voltage converter and voltage converters ranked higher than said next-highest voltage converter; and
    (iii) repeating step (ii) for each subsequent voltage converter in the ranking; and
  generating one or more signals that define the calculated switching phase offsets to be applied to the switching of the respective switching elements.

* * * * *